(12) United States Patent
Shin et al.

(10) Patent No.: US 7,916,229 B2
(45) Date of Patent: Mar. 29, 2011

(54) LIQUID CRYSTAL DISPLAY DEVICE AND METHOD FOR FABRICATING THE SAME

(75) Inventors: Woo Sup Shin, Gyeonggi-do (KR); Joo Soo Lim, Gyeongsangbuk-do (KR); Heung Lyul Cho, Gyeonggi-do (KR); Hee Young Kwack, Seoul (KR)

(73) Assignee: LG Display Co., Ltd., Seoul (KR)

( * ) Notice: Subject to any disclaimer, the term of this patent is extended or adjusted under 35 U.S.C. 154(b) by 286 days.

(21) Appl. No.: 12/318,263

(22) Filed: Dec. 23, 2008

(65) Prior Publication Data

US 2009/0284677 A1 Nov. 19, 2009

(30) Foreign Application Priority Data

May 16, 2008 (KR) .......................... 10-2008-0045621

(51) Int. Cl.
*G02F 1/136* (2006.01)
*G02F 1/1368* (2006.01)
*G02F 1/1343* (2006.01)
*H01L 21/02* (2006.01)

(52) U.S. Cl. ............ 349/42; 349/46; 349/139; 349/141; 257/59

(58) Field of Classification Search .............. 257/40, 257/41, 42, 59, 72; 349/42, 46, 139, 140, 349/141

See application file for complete search history.

(56) References Cited

U.S. PATENT DOCUMENTS

| 6,118,508 A * | 9/2000 | Park ............................. 349/141 |
| 6,407,791 B1 * | 6/2002 | Suzuki et al. ................. 349/129 |
| 7,482,622 B2 * | 1/2009 | Park ............................... 257/40 |
| 7,612,378 B2 * | 11/2009 | Toyoda et al. .................. 257/72 |
| 2006/0139548 A1 * | 6/2006 | Ahn .............................. 349/141 |
| 2008/0013026 A1 * | 1/2008 | Choi et al. .................... 349/139 |

FOREIGN PATENT DOCUMENTS

| CN | 1794076 A | 6/2006 |
| CN | 101097365 A | 1/2008 |

* cited by examiner

*Primary Examiner* — Akm E Ullah
(74) *Attorney, Agent, or Firm* — Morgan, Lewis & Bockius LLP

(57) ABSTRACT

A liquid crystal display device includes a gate line on a substrate; a data line crossing the gate line with a gate insulating film interposed between the gate line and the data line to define a pixel region; a thin film transistor at the crossing of the gate line and the data line; a pixel electrode connected to the thin film transistor; a common electrode forming a horizontal electric field with the pixel electrode in the pixel region; a gate pad connected to the gate line; and a data pad connected to the data line, wherein the gate pad and the data pad includes a lower pad in the same layer as the gate line and made of the same material as the gate line, a lower contact hole through the gate insulating film to expose the lower pad, an upper pad in the same layer as the data line, made of the same material as the data line, and connected to the lower pad through the lower contact hole, and an upper contact hole through a passivation film protecting the thin film transistor to expose the upper pad, and a semiconductor layer of the thin film transistor overlaps with the gate electrode of the thin film transistor, and has a width smaller than that of a gate electrode of the thin film transistor.

18 Claims, 27 Drawing Sheets

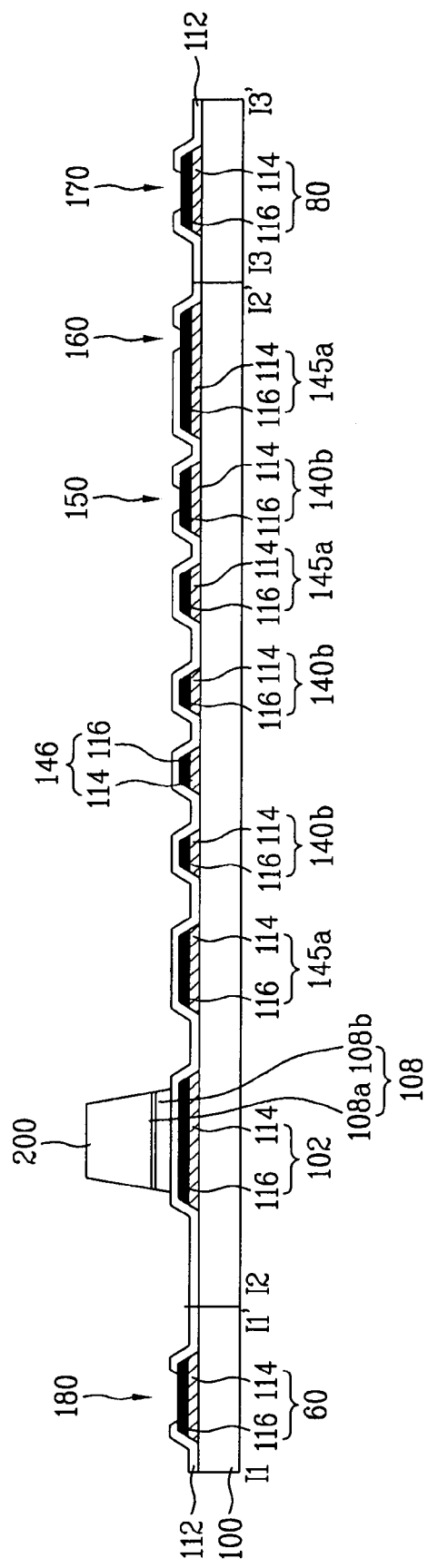

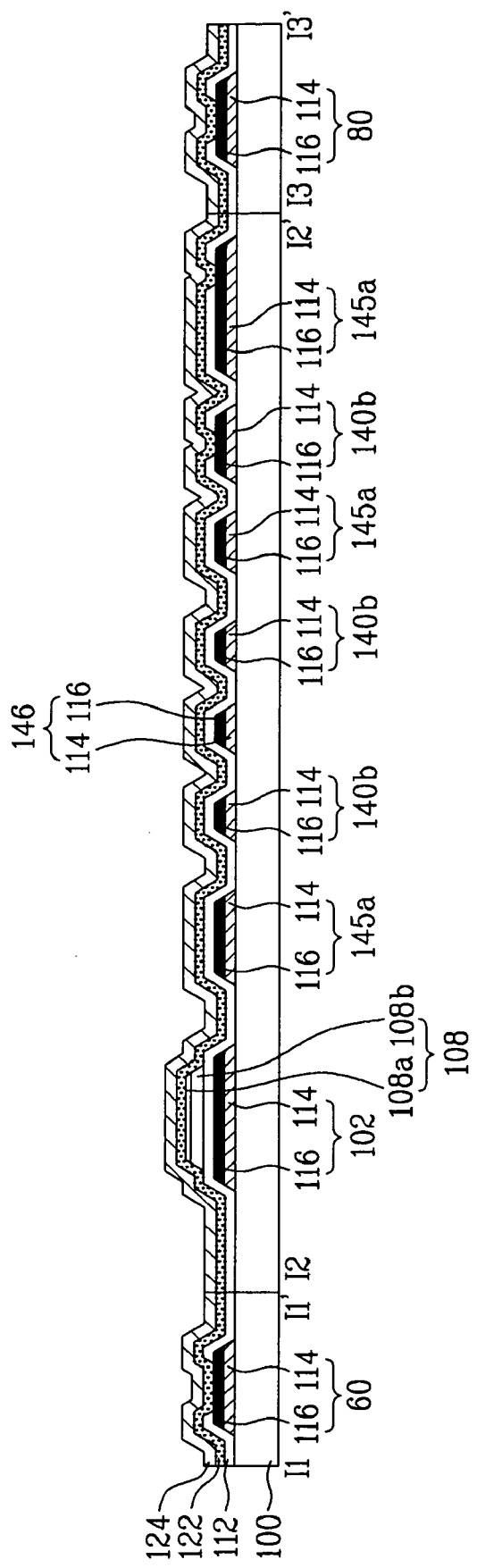

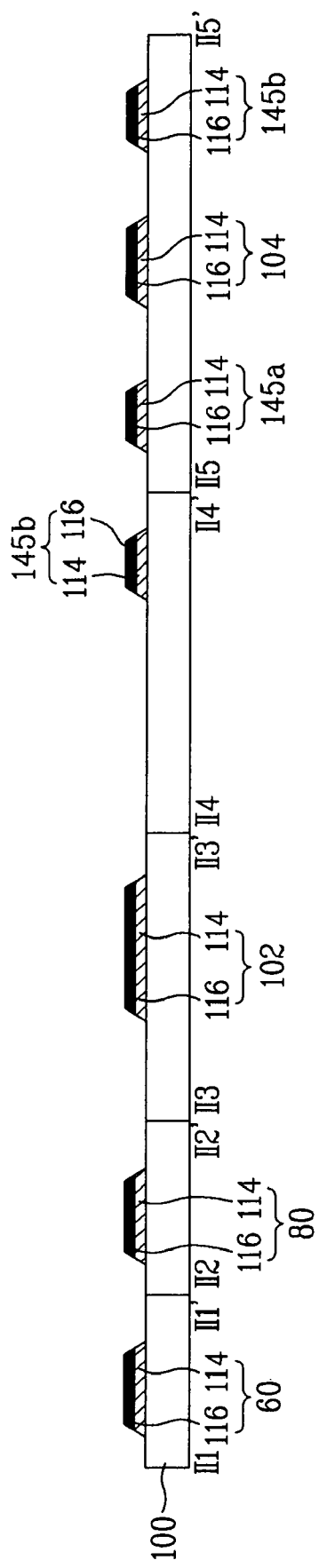

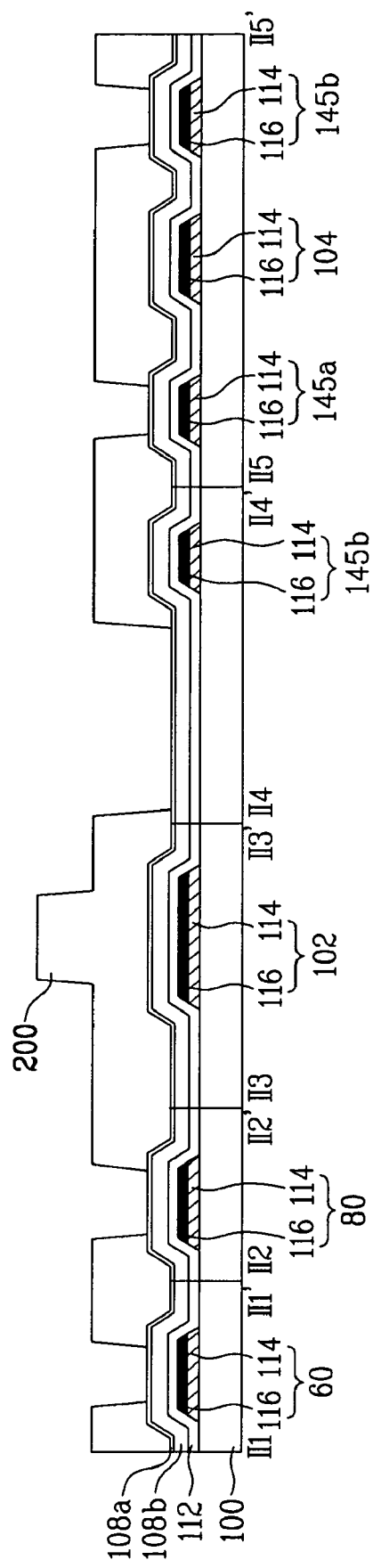

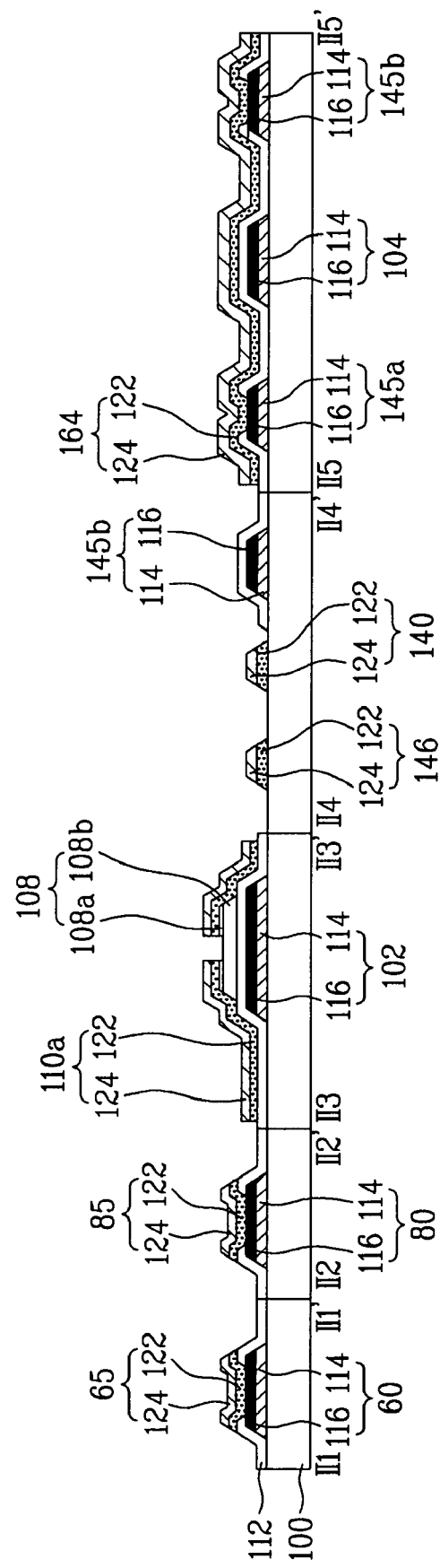

LIQUID CRYSTAL DISPLAY DEVICE AND METHOD FOR FABRICATING THE SAME

This application claims the benefit of Korean Patent Application No. 10-2008-0045621, filed on May 16, 2008, which is hereby incorporated by reference in its entirety.

BACKGROUND OF THE INVENTION

1. Field of the Invention

The present invention relates to a liquid crystal display device, and more particularly, to a liquid crystal display device, which enhances an aperture ratio and minimizes off current, and a method for fabricating the same.

2. Discussion of the Related Art

As an information-oriented age has been introduced, requirements for display devices have been variously increased, and in order to satisfy this increase, various flat display devices, such as a liquid crystal display (LCD), a plasma display panel (PDP), an electro luminescent display (ELD), a vacuum fluorescent display (VFD), etc., have been researched, and some flat display devices have been already applied to several equipment.

Among the above flat display devices, a liquid crystal display, which replaces a conventional cathode ray tube (CRT), is most widely used as a mobile image display device due to its advantages, such as light weight, thin profile, and low power consumption, and is variously developed to be used as a television receiving a broadcast signal and displaying an image and a monitor of a computer in addition to the mobile image display device, such as a monitor of a notebook computer.

In general, a liquid crystal display device includes a thin film transistor substrate, a color filter substrate, and a liquid crystal layer formed between the two substrates.

The thin film transistor substrate includes a plurality of gate lines and a plurality of data lines, which are disposed lengthwise and crosswise to define a plurality of pixel regions, thin film transistors respectively formed at the crossings of the gate lines and the data lines and serving as switching elements, and pixel electrodes respectively formed on the pixel regions.

The color filter substrate includes color filters to express colors, and a black matrix to divide the color filters from each other and prevent the reflection of external light.

The thin film transistor substrate of the liquid crystal display device requires a semiconductor process and a plurality of mask processes and has a complicated fabricating method, and is thus a main factor raising the fabricating cost of the liquid crystal display device.

Therefore, a method, in which a semiconductor layer and a source/drain pattern including data lines and source/drain electrodes are formed by one mask process to reduce the number of mask processes required, has been proposed. In this method, the source/drain pattern is formed by a first etching process to form the same pattern as the semiconductor layer and a second etching process to separate the source/drain electrodes.

Here, since the semiconductor layer is formed through one time of the etching process but the data lines on the semiconductor layer are formed through two times of the etching process, the line width of the data lines is smaller than the line width of the semiconductor layer disposed under the data lines.

Therefore, the semiconductor layer has a structure, which is protruded from both sides of the data lines to the pixel regions. The pixel electrodes formed in the pixel regions must be separated from the data lines and the semiconductor layer so as to reduce the effect of parasitic capacitance.

Thereby, the area of the pixel electrodes is reduced as large as the area of the protrusions of the semiconductor layers from the data lines.

Further, the semiconductor layer formed under the data lines is made of amorphous silicon containing hydrogen, and absorbs light when light from a backlight unit is incident upon the semiconductor layer. Due to the absorbance of light by the semiconductor layer, off current is increased even when the thin film transistors are turned off.

More specifically, since bonding between silicon and hydrogen in the semiconductor layer made of amorphous silicon is exceedingly weak, when light is irradiated on the semiconductor layer, the bonding between silicon and hydrogen is broken off and thus electrons move to the surface of the semiconductor layer (i.e., photo current).

The above photo current causes the lowering of operating characteristics of the thin film transistors.

Further, as the off current is increased, an on/off current ratio (Ion/Ioff) affecting characteristics of the liquid crystal display device is decreased, and thus lowers the productivity and reliability of a product due to shortening of the life span of the liquid crystal display device and deepening of an after-image.

SUMMARY OF THE INVENTION

Accordingly, the present invention is directed to a liquid crystal display device and a method for fabricating the same that substantially obviates one or more problems due to limitations and disadvantages of the related art.

An object of the present invention is to enhance an aperture ratio of a liquid crystal display device.

Another object of the present invention is to provide a method for fabricating a liquid crystal display device having an enhanced an aperture ratio.

Another object of the present invention is to minimize on off current in a liquid crystal display device.

Another object of the present invention is to provide a method for fabricating a liquid crystal display device having a minimum off current.

To achieve this object and other advantages and in accordance with the purpose of the invention, as embodied and broadly described herein, a liquid crystal display device includes a gate line on a substrate; a data line crossing the gate line with a gate insulating film interposed between the gate line and the data line to define a pixel region; a thin film transistor at the crossing of the gate line and the data line; a pixel electrode connected to the thin film transistor; a common electrode forming a horizontal electric field with the pixel electrode in the pixel region; a gate pad connected to the gate line; and a data pad connected to the data line, wherein the gate pad and the data pad includes a lower pad in the same layer as the gate line and made of the same material as the gate line, a lower contact hole through the gate insulating film to expose the lower pad, an upper pad in the same layer as the data line, made of the same material as the data line, and connected to the lower pad through the lower contact hole, and an upper contact hole through a passivation film protecting the thin film transistor to expose the upper pad, and a semiconductor layer of the thin film transistor overlaps with the gate electrode of the thin film transistor, and has a width smaller than that of a gate electrode of the thin film transistor.

In another aspect, a method for fabricating a liquid crystal display device includes forming a gate pattern including a gate line, a gate electrode, a gate lower pad, and a data lower pad on a substrate; forming a gate insulating film, including lower contact holes to expose the gate lower pad and the data lower pad, and a semiconductor layer overlapping the gate electrode on the substrate provided with the gate pattern; forming a source/drain pattern including a gate upper pad, a data upper pad, a data line, and source and drain electrodes on the gate insulating film provided with the semiconductor layer; forming upper contact holes to expose the gate upper pad and the data upper pad, and a passivation film to expose pixel region on the source/drain pattern; and forming a common electrode and a pixel electrode when the gate pattern or the source/drain pattern is formed, wherein the forming of the passivation film includes forming the passivation film on the source/drain pattern, removing the passivation film to expose the gate upper pad and the data upper pad, removing the gate insulating film and the passivation film on the pixel region to expose the pixel region, and removing the uppermost layer of the pixel electrode and the common electrode on the pixel region.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings:

FIGS. 4A to 4C are plan and longitudinal-sectional views, respectively, illustrating a second mask process in the thin film transistor substrate fabricating method in accordance with the first embodiment of the present invention;

FIGS. 5A to 5D are plan and longitudinal-sectional views, respectively, illustrating a third mask process in the thin film transistor substrate fabricating method in accordance with the first embodiment of the present invention;

FIGS. 9A and 9B are plan and longitudinal-sectional views, respectively, illustrating a first mask process in a thin film transistor substrate fabricating method in accordance with the second embodiment of the present invention;

FIGS. 10A to 10C are plan and longitudinal-sectional views, respectively, illustrating a second mask process in the thin film transistor substrate fabricating method in accordance with the second embodiment of the present invention;

FIGS. 11A to 11C are plan and longitudinal-sectional views, respectively, illustrating a third mask process in the thin film transistor substrate fabricating method in accordance with the second embodiment of the present invention.

DETAILED DESCRIPTION OF PREFERRED EMBODIMENTS

Hereinafter, with reference to the accompanying drawings, a liquid crystal display device in accordance with preferred embodiments of the invention will be described in detail.

Figure 1:
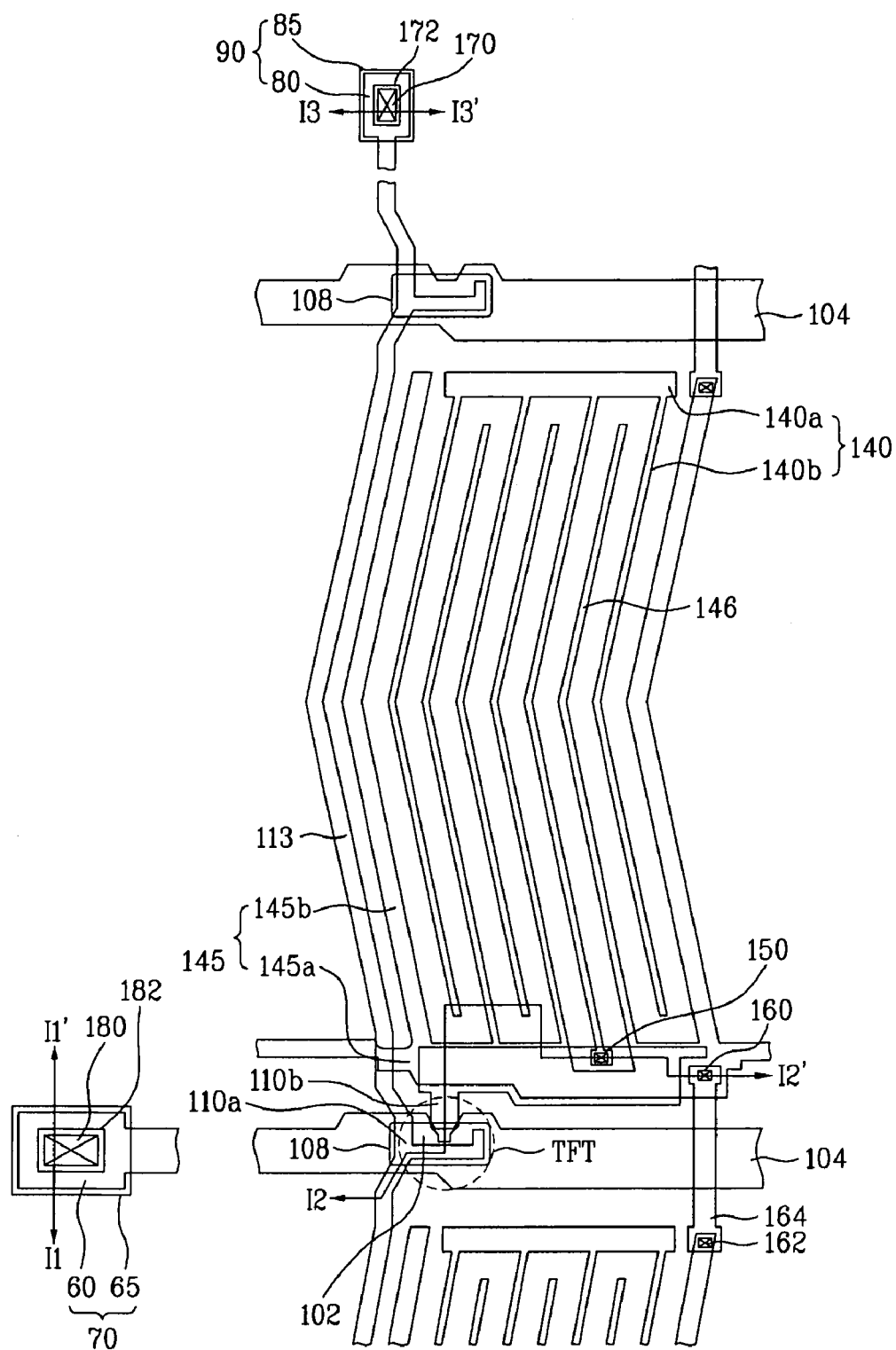
FIG. 1 is a plan view illustrating a thin film transistor substrate of an in-plane switching mode liquid crystal display device in accordance with a first embodiment of the present invention.
Figure 2:
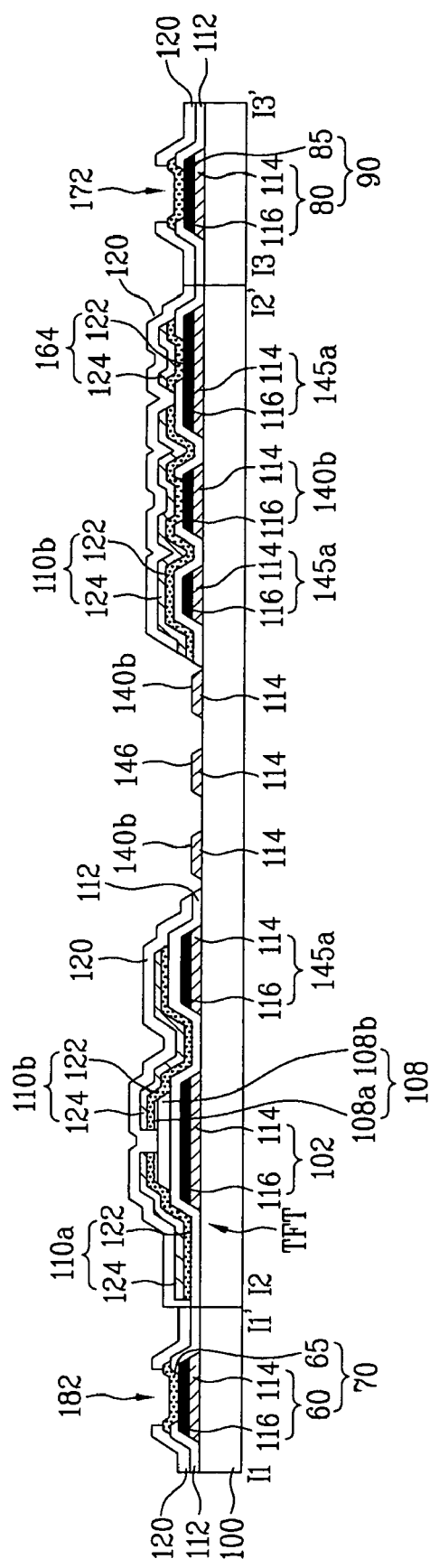
FIG. 2 is a longitudinal-sectional view illustrating the thin film transistor substrate taken along the lines I1-I1' to I3-I3' of FIG. 1.

FIG. 1 is a plan view illustrating a thin film transistor substrate of an in-plane switching mode liquid crystal display device in accordance with a first embodiment of the present invention, and FIG. 2 is a longitudinal-sectional view illustrating the thin film transistor substrate taken along the lines I1-I1' to I3-I3' of FIG. 1.

The in-plane switching mode liquid crystal display device, as shown in FIGS. 1 and 2, includes a gate line 104 formed on a substrate 100, a data line 113 intersecting the gate line 104 under the condition that a gate insulating film 112 is interposed between the gate line 104 and the data line 113 to define a pixel region, a thin film transistor (TFT) formed at the crossing of the gate line 104 and the data line 113, a pixel electrode 140 connected to the thin film transistor (TFT), a common electrode 146 forming a horizontal electric field with the pixel electrode 140 in the pixel region, a common line 145 connected to the common electrode 146 to supply common voltage for driving liquid crystals to the common electrode 146, a gate pad 70 connected to the gate line 104, and a data pad 90 connected to the data line 113.

The thin film transistor (TFT) includes a gate electrode 102 branched off from the gate line 104, a gate insulating film 112 formed on the entire surface of the substrate 100 provided with the gate electrode 102, a semiconductor layer 108 including an ohmic contact layer 108a and an active layer 108b and overlapping with the gate electrode 102 on the gate insulating film 112, a source electrode 110a branched off from the data line 113 and formed on the semiconductor layer 108, and a drain electrode 110b formed on the semiconductor layer 108 opposite to the source electrode 110a.

Here, the width of the semiconductor layer 108 is smaller than the width of the gate electrodes 102. The semiconductor layer 108 is formed in an island shape under the source and drain electrodes 110a and 110b, but is not formed under the data line 113. When the semiconductor layer 108 is not formed under the data line 113, the separation distance between the data line 113 and the pixel electrode 140 or the common line 145 causing parasitic capacitance is reduced, compared with a case that the semiconductor layer 108 is formed under the data line 113. Thus, the area of the pixel region is increased, i.e., an aperture ratio is increased to the same level as that obtained by a 5-mask process.

The semiconductor layer 108 is formed in an island shape having a smaller width than that of the gate electrode 102, and thus an off current (Ioff) property due to photo current is enhanced. Further, it is possible to solve problems, such shortening of the life span of the liquid crystal display device and deepening of an after-image, due to an increase in off current caused by the absorption of light from a backlight unit by the semiconductor layer 108.

The pixel electrode 140 includes pixel electrode finger parts 140b electrically connected to the drain electrode 110b through a first contact hole 150, and a pixel electrode horizontal part 140a connected to the pixel electrode finger parts 140b and formed parallel with the gate line 104. The pixel electrode finger parts 140b are formed parallel with the common electrodes 146 to form the horizontal electric field with the common electrodes 146.

The common line 145 include first common line 145a connected to the common electrodes 146 and formed parallel with the gate line 104, and second common line 145b connected to the first common line 145a and formed parallel with the common electrode 146. It is additionally provided a common connection part 164 to connect the neighboring first and second common lines 145a crossing the gate line 104 between the neighboring first and second common lines 145a and 145b. The common connection part 164 connects the neighboring first and second common lines 145a through second and third contact holes 160 and 162. The first common line 145a and the second common line 145b are formed in a mesh structure and thus minimally reduces load.

The first common line 145a overlaps with the drain electrode 110b under the condition that the gate insulating film 112 is interposed between the first common line 145a and the drain electrode 110b, and thus forms a storage capacitor.

At least one of the pixel electrode finger parts 140b is electrically connected to the drain electrode 110b through the first contact hole 150, and the first common line 145a at the contact region between the pixel electrode finger part 140b and the drain electrode 110b has a depressed shape such that the first common line 145a at the contact region does not overlap with the pixel electrode finger part 140b.

The gate insulating film 112 and a passivation film 120 on the pixel electrode finger parts 140b and the common electrodes 146 on the pixel regions are removed to expose the substrate 100, and thus brightness is enhanced. Further, since the gate insulating film 112 and the passivation film 120 are not located on the pixel region, an amount of liquid crystals on a non-pixel region is reduced due to with a cell gap unchanged, and thus cost-saving is possible.

The gate line 104 and the common line 145 are made of the same material and formed in the same layer, and constitute a multilayered structure including at least two layers. Further, the data line 113, the common connection part 164, and the source and drain electrodes 110a and 110b constitute a multilayered structure including at least two layers. For example, the uppermost layer is made of any one material having high conductivity, selected from the group consisting of copper (Cu), molybdenum (Mo), aluminum (Al), aluminum-neodymium (AlNd), molybdenum-titanium (MoTi), chrome (Cr), and their combinations, and the lowermost layer is made of any one material having high anticorrosion, selected from the group consisting of indium tin oxide (ITO), tin oxide (TO), indium zinc oxide (IZO), indium tin zinc oxide (ITZO), molybdenum (Mo), chrome (Cr), titanium (Ti), molybdenum-titanium (MoTi), and their combinations.

The common electrode 146 and the pixel electrode 140 form the lowermost layer in the same layer as that of the gate line 104.

The gate pad 70 includes a lower pad 60 made of the same material as the gate line 104, and an upper pad 65 forming the lowermost layer of a source/drain metal. The gate lower pad 60 is electrically connected to the gate upper pad 65 through a gate lower contact hole 180, and the gate upper pad 65 is exposed through a gate upper contact hole 182.

The data pad 90 includes a lower pad 80 made of the same material as the gate line 104, and an upper pad 85 forming the lowermost layer of the source/drain metal. The data lower pad 80 is electrically connected to the data upper pad 85 through a data lower contact hole 170, and the data upper pad 85 is exposed through a data upper contact hole 172.

Although not shown in the drawings, the thin film transistor substrate 100 is bonded to a color filter substrate under the condition that a liquid crystal layer is interposed between the two substrates. The color filter substrate includes a black matrix to prevent leakage of light and divide the pixel regions from each other, and a color filter layer to express colors. The black matrix is formed corresponding to metal patterns, such as the gate line 104 and the data line 113 on the thin film transistor substrate 100.

Figure 3A:
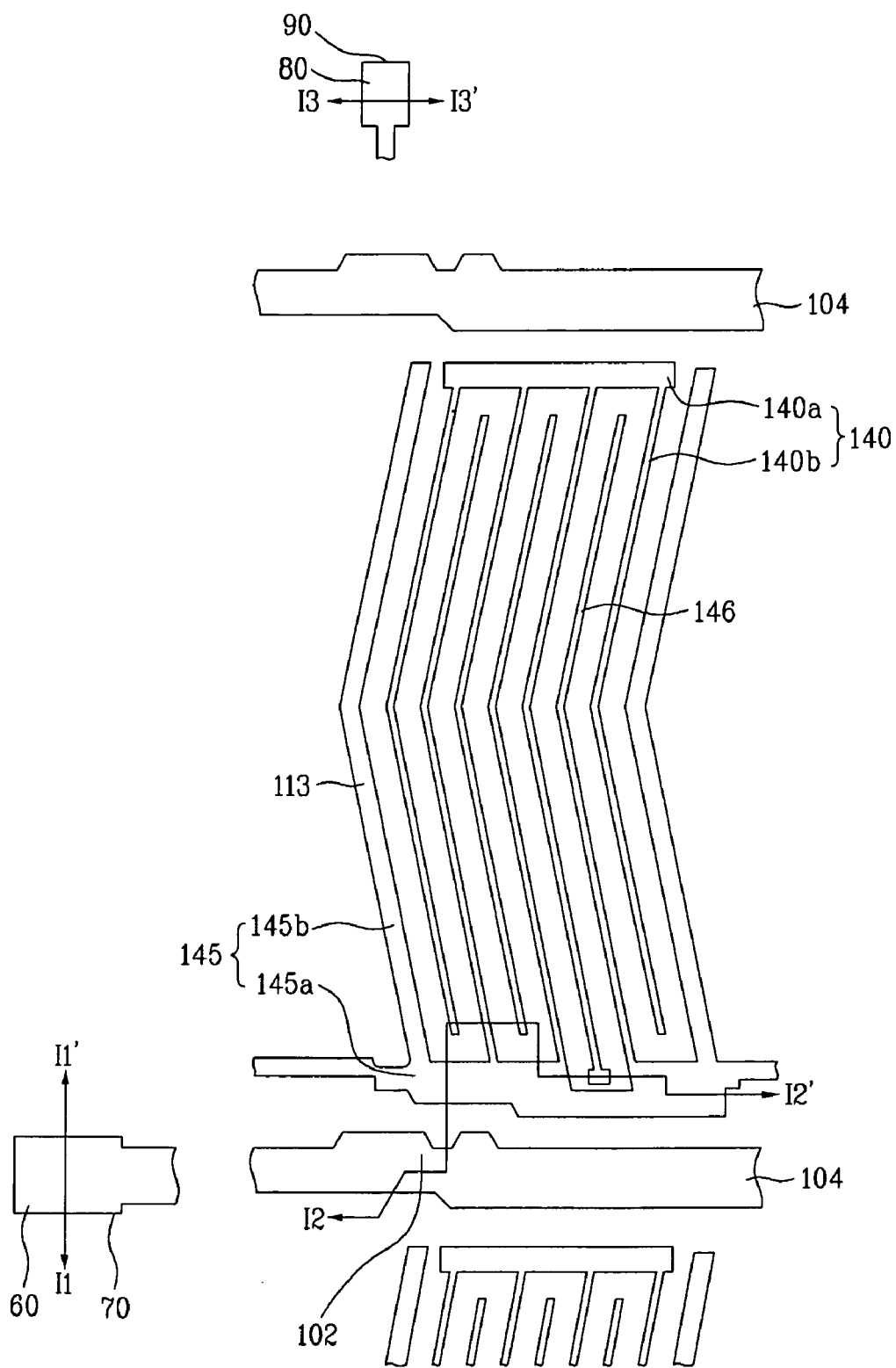
FIGS. 3A and 3B are plan and longitudinal-sectional views, respectively, illustrating a first mask process in a thin film transistor substrate fabricating method in accordance with the first embodiment of the present invention.
Figure 3B:
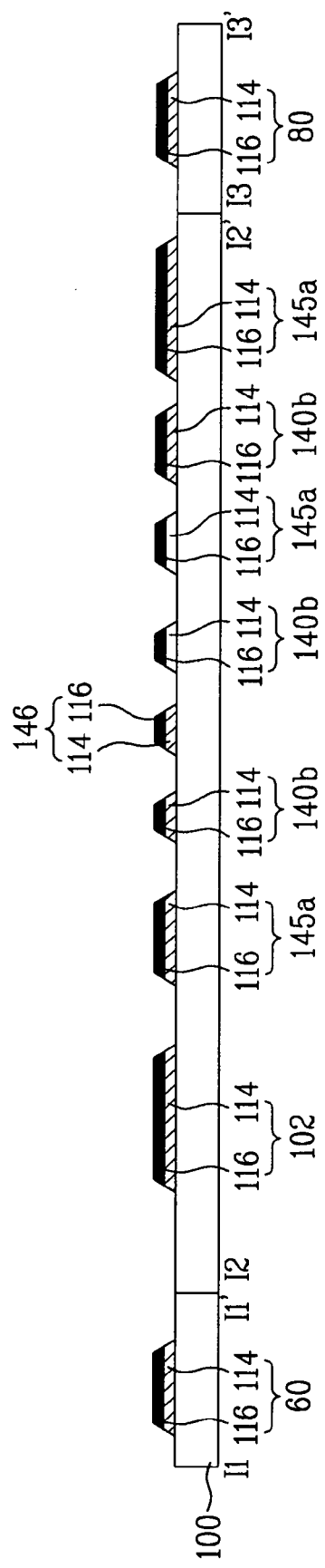

FIGS. 3A and 3B are plan and longitudinal-sectional views illustrating a first mask process in a thin film transistor substrate fabricating method in accordance with the first embodiment of the present invention.

With reference to FIGS. 3A and 3B, a multi-layered gate pattern including the gate lower pad 60, the gate line 104, the gate electrode 102, the common line 145, the common electrode 146, the pixel electrode 140, and the data lower pad 80 is formed on the thin film transistor substrate 100.

Specifically, gate metal layers 114 and 116 are formed on the substrate 100 by a deposition method, such as sputtering. Then, the gate pattern including the gate lower pad 60, the gate line 104, the gate electrode 102, the common line 145, the common electrode 146, the pixel electrode 140, and the data lower pad 80 is formed by patterning the gate metal layers 114 and 116 through a photolithography process using a first mask and a wet etching process.

The pixel electrode 140 includes the pixel electrode finger parts 140b formed parallel with the data line 113, and the pixel electrode horizontal part 140a connected to the pixel electrode finger parts 140b and formed parallel with the gate line 104.

The common line 145 include the first common line 145a connected to the common electrodes 146 and formed parallel with the gate line 104, and the second common line 145b connected to the first common line 145a and formed parallel with the common electrodes 146. Here, the first common line 145a at the contact region between the pixel electrode finger part 140b and the drain electrode 110b has a depressed shape such that the first common line 145a at the contact region does not overlap with the pixel electrode finger part 140b.

The gate metal layers 114 and 116 constitute a multilayered structure including at least two layers. Here, the uppermost layer made of any one material selected from the group consisting of copper (Cu), molybdenum (Mo), aluminum (Al), aluminum-neodymium (AlNd), molybdenum-titanium (MoTi), chrome (Cr), and their combinations, and the lowermost layer is made of any one material selected from the group consisting of indium tin oxide (ITO), tin oxide (TO), indium zinc oxide (IZO), indium tin zinc oxide (ITZO), molybdenum (Mo), chrome (Cr), titanium (Ti), molybdenum-titanium (MoTi), and their combinations.

Figure 4A:
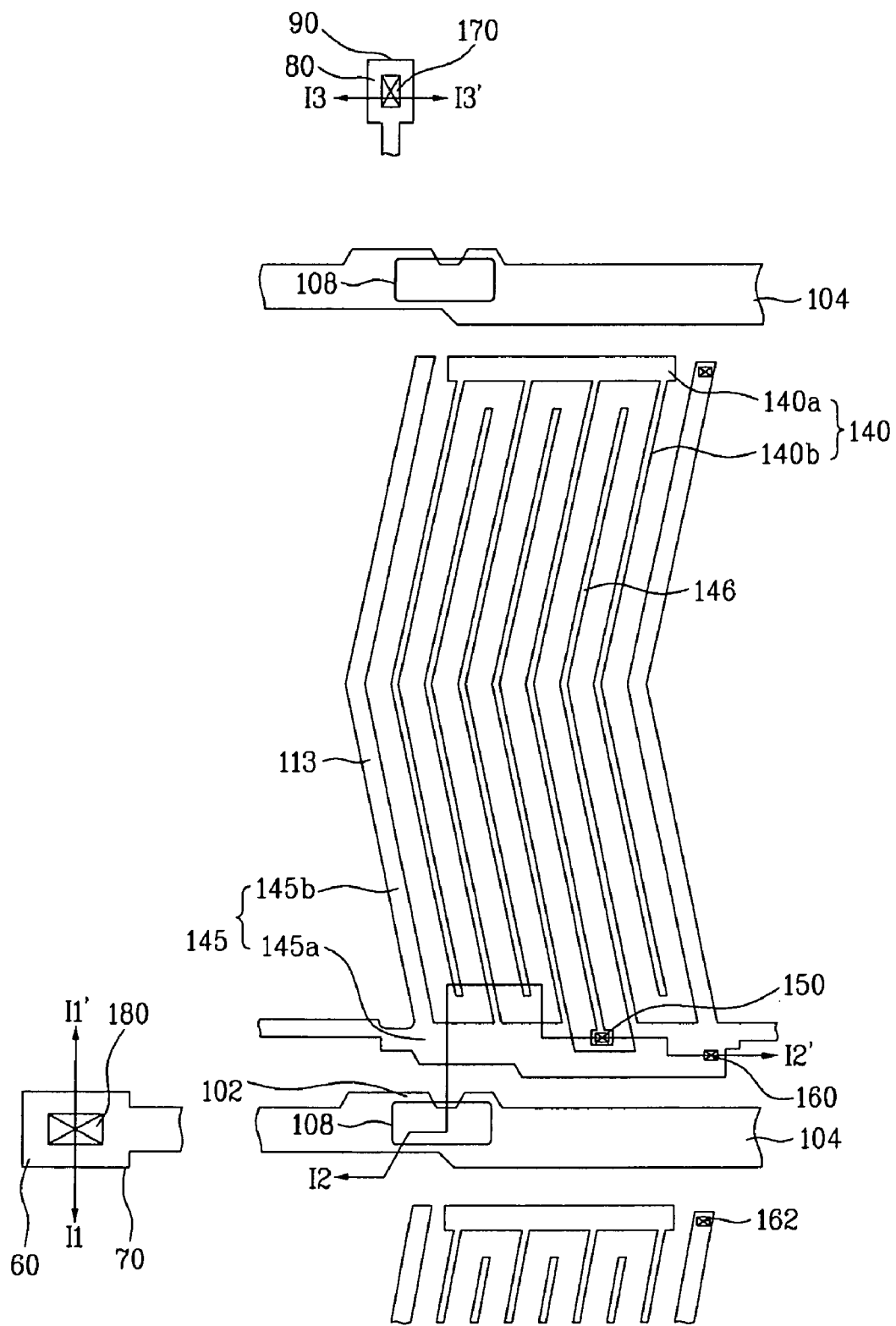
Figure 4B:
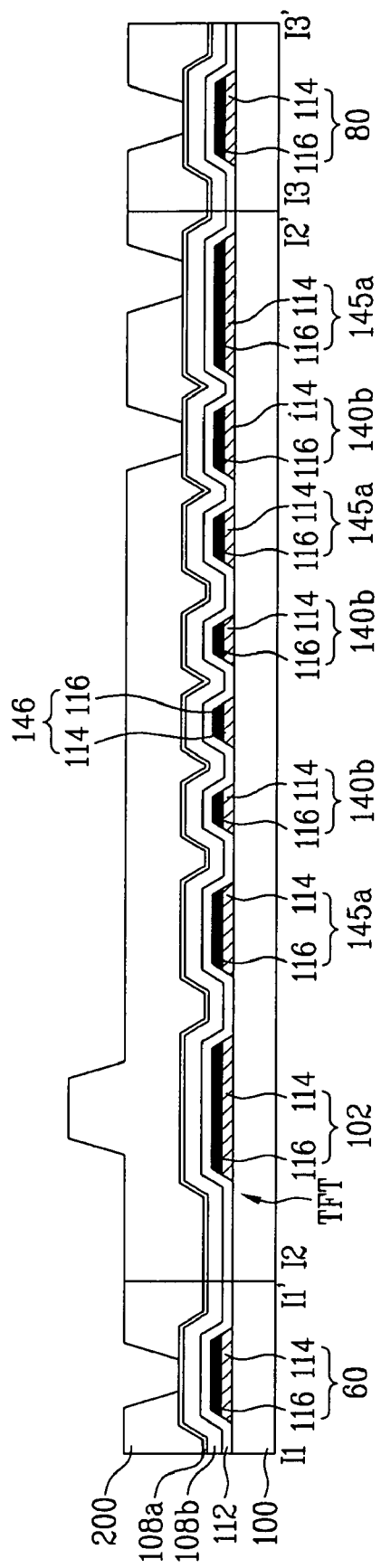
Figure 5A:
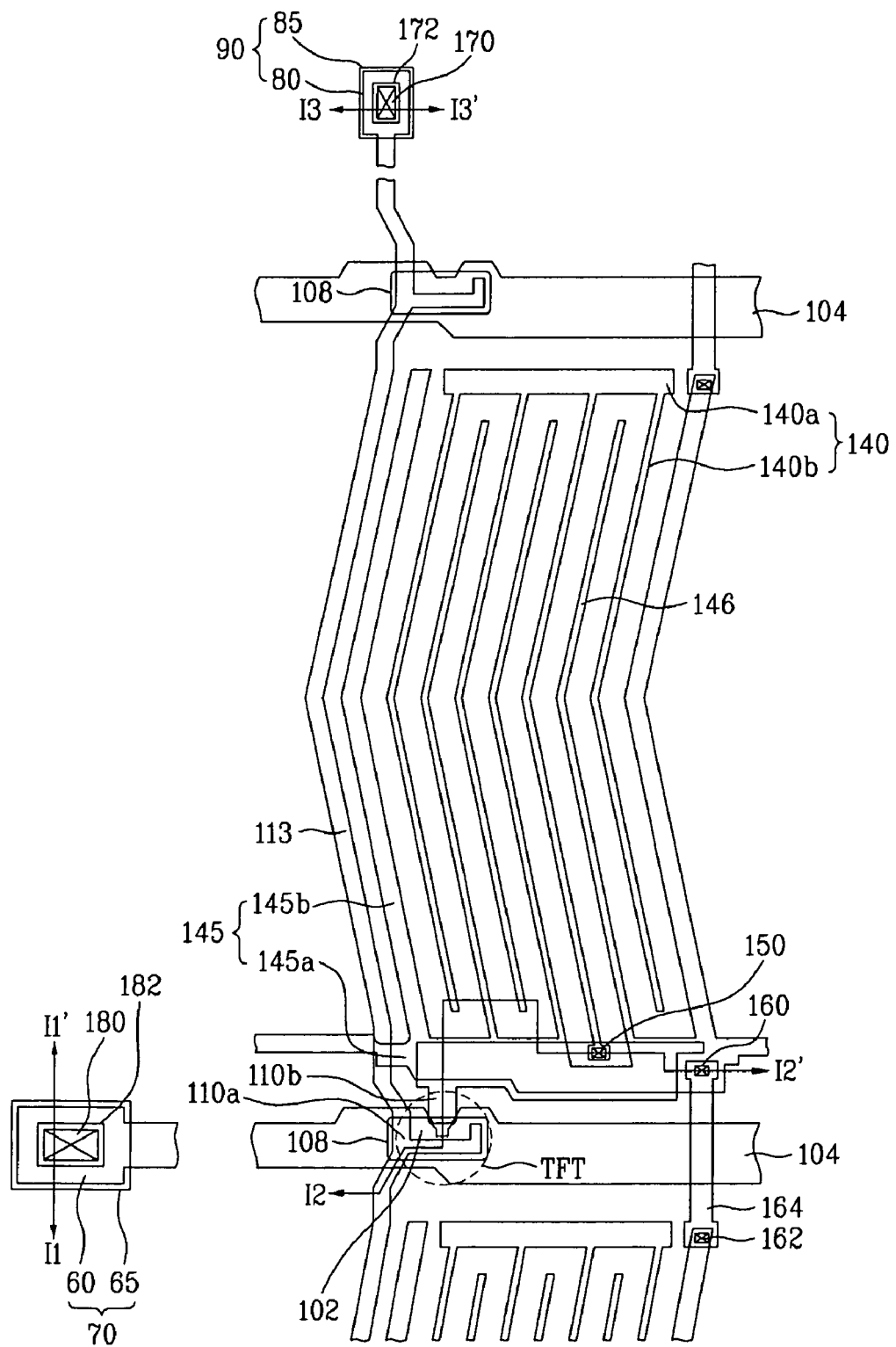
Figure 5C:
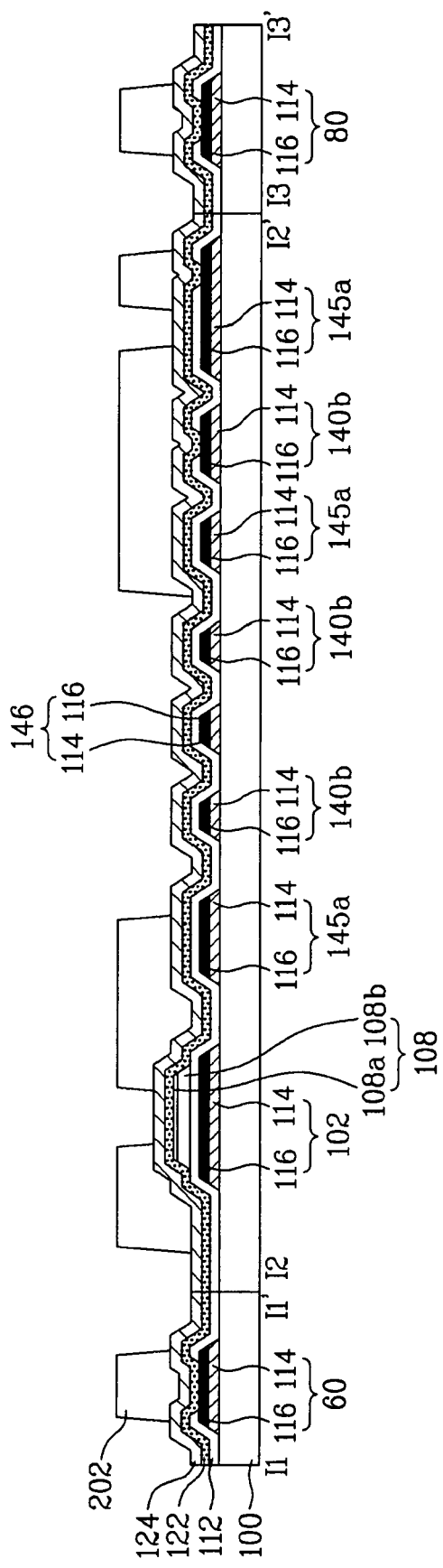
Figure 5D:
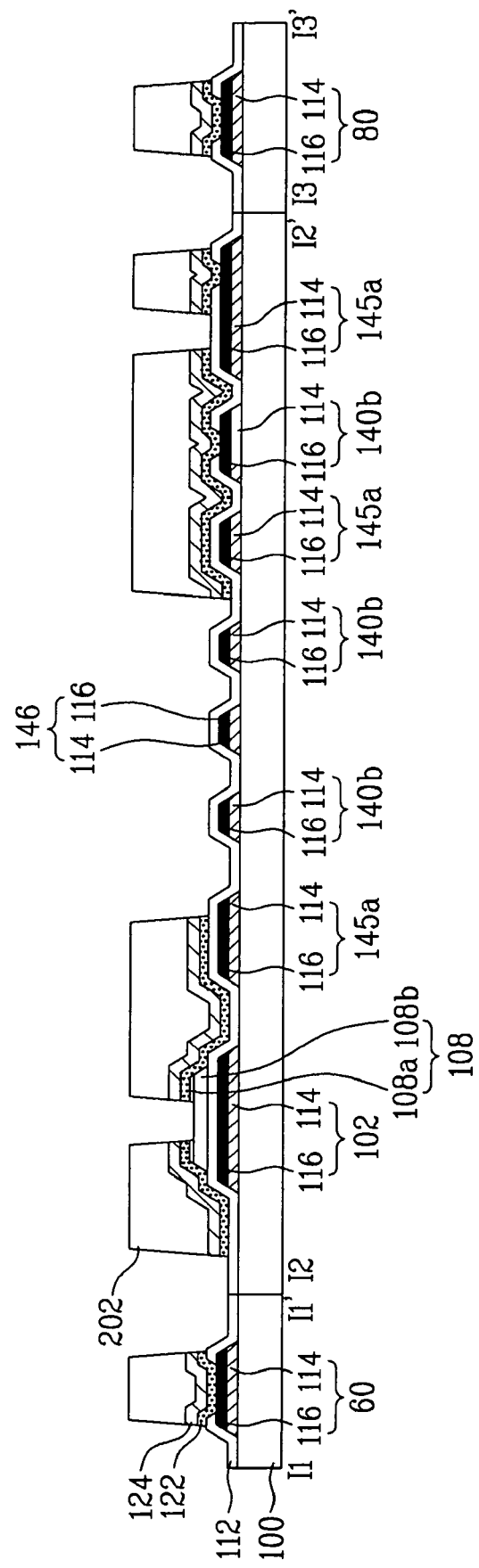

FIGS. 4A to 4C are plan and longitudinal-sectional views illustrating a second mask process in the thin film transistor substrate fabricating method in accordance with the first embodiment of the present invention.

With reference to FIGS. 4A to 4C, the gate insulating film 112 and the semiconductor layer 108 are sequentially formed on the gate pattern.

Specifically, the gate insulating film 112, an amorphous silicon (a-Si) layer 108b, and an amorphous silicon layer doped with impurity (n+) 108a are sequentially formed on the entire surface of the substrate 100 including the gate pattern by a deposition method, such as plasma enhanced chemical vapor deposition (PECVD), and then a photoresist (not shown) is applied thereto.

The gate insulating film 112 is made of an inorganic insulating material, such as silicon oxide ($SiO_x$) or silicon nitride ($SiN_x$).

A photoresist pattern 200 is formed by aligning a second mask (not shown) on the upper surface of the photoresist (not shown) and then exposing and developing the photoresist (not shown). The photoresist pattern 200 is formed to expose regions for the gate lower contact hole 180, the data lower contact hole 170, and the first to third contact holes 150, 160, and 162 (in FIG. 4A), and the photoresist pattern 200 in regions corresponding to the thin film transistors (TFT) has a larger thickness than that of the photoresist pattern 200 in other regions.

Thereafter, the gate lower contact hole 180 exposing the gate lower pad 60, the data lower contact hole 170 exposing the data lower pad 80, the first contact hole 150 exposing the pixel electrode finger part 140b, the second contact hole 160 exposing the second common line 145b, and the third contact hole 162 exposing the first common line 145a are formed by etching the gate insulating film 112 and the semiconductor layer 108 using the photoresist pattern 200 as a mask.

Thereafter, the thickness of the photoresist pattern 200 is reduced by an ashing process. Thus, the photoresist pattern 200 remains only on the gate electrode 102, and is removed from other regions. Through a dry etching process using the photoresist pattern 200 on the gate electrode 102, the semiconductor layer 108 is formed in an island shape having a smaller line width than that of the gate electrode 102 such that the semiconductor layer 108 overlaps with the gate electrode 102 under the condition that the gate insulating film 112 is interposed therebetween.

The second mask employs a diffraction mask or a half tone mask to allow the photoresist pattern 200 to have a double step difference.

FIGS. 5A to 5D are plan and longitudinal-sectional views illustrating a third mask process in the thin film transistor substrate fabricating method in accordance with the first embodiment of the present invention.

With reference to FIGS. 5A to 5D, a source/drain pattern including the gate upper pad 65, the data upper pad 85, the common connection part 164, the data line 113, and the source and drain electrodes 110a and 110b is formed on the gate insulating film 112 including the gate lower contact hole 180, the data lower contact hole 170, and the first to third contact holes 150, 160, and 162.

Specifically, source/drain metal layers 122 and 124 are formed on the gate insulating film 112 including the gate lower contact hole 180, and the data lower contact hole 170, the first to third contact holes 150, 160, and 162 by a deposition method, such as sputtering, and then a photoresist (not shown) is applied thereto. Thereafter, a photoresist pattern 202 corresponding to regions for the gate upper pad 65, the data upper pad 85, the common connection part 164, the data line 113, and the source and drain electrodes 110a and 110b is formed by aligning a third mask (not shown) on the upper surface of the photoresist (not shown) and then exposing and developing the photoresist (not shown).

Thereafter, the source/drain pattern including the gate upper pad 65, the data upper pad 85, the common connection part 164, the data line 113, and the source and drain electrodes 110a and 110b is formed by removing the source/drain metal layers 122 and 124 through a wet etching process using the photoresist pattern 202. Then, the ohmic contact layer 108a in channel regions between the source and drain electrodes 110a and 110b is removed by dry etching, and the remaining photoresist pattern 202 is removed through a strip process.

Here, the common connection part 164 connects the neighboring first and second common lines 145a and 145b crossing the gate line 104 through the second and third contact holes 160 and 162 in a mesh structure, and thus minimally reduces load.

The drain electrode 110b overlaps with the first common line 145a under the condition that the gate insulating film 112 is interposed between the first common line 145a and the drain electrode 110b, and thus forms a storage capacitor.

The source/drain metal layers 122 and 124 constitute a multilayered structure including at least two layers. The uppermost layer is made of any one material selected from the group consisting of copper (Cu), molybdenum (Mo), aluminum (Al), aluminum-neodymium (AlNd), molybdenum-titanium (MoTi), chrome (Cr), and their combinations, and the lowermost layer is made of any one material selected from the group consisting of indium tin oxide (ITO), tin oxide (TO), indium zinc oxide (IZO), indium tin zinc oxide (ITZO), molybdenum (Mo), chrome (Cr), titanium (Ti), molybdenum-titanium (MoTi), and their combinations.

Figure 6A:
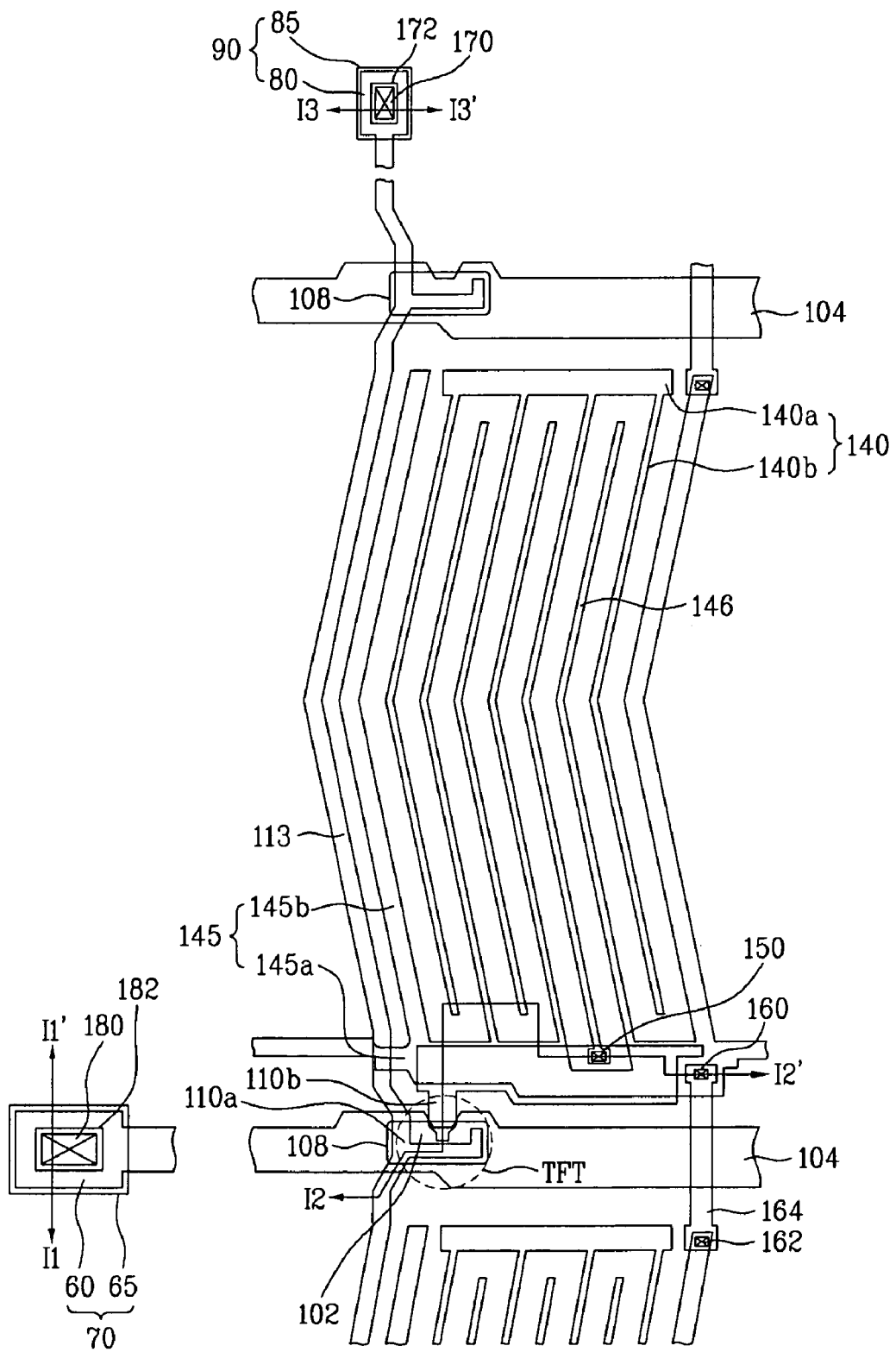
FIGS. 6A to 6C are plan and longitudinal-sectional views, respectively, illustrating a fourth mask process in the thin film transistor substrate fabricating method in accordance with the first embodiment of the present invention.
Figure 6B:
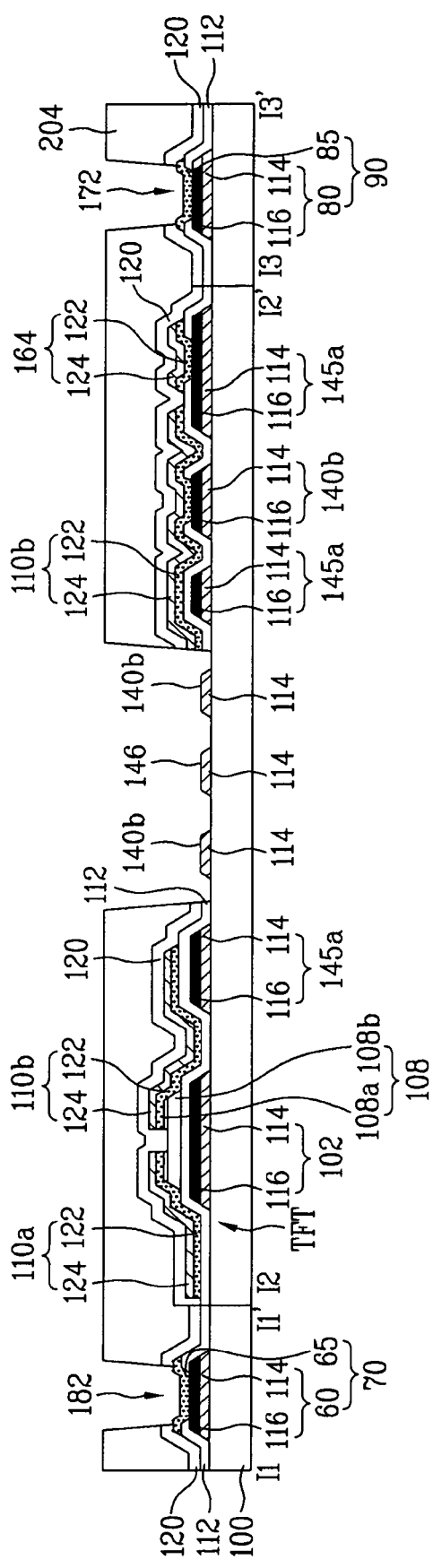
Figure 6C:
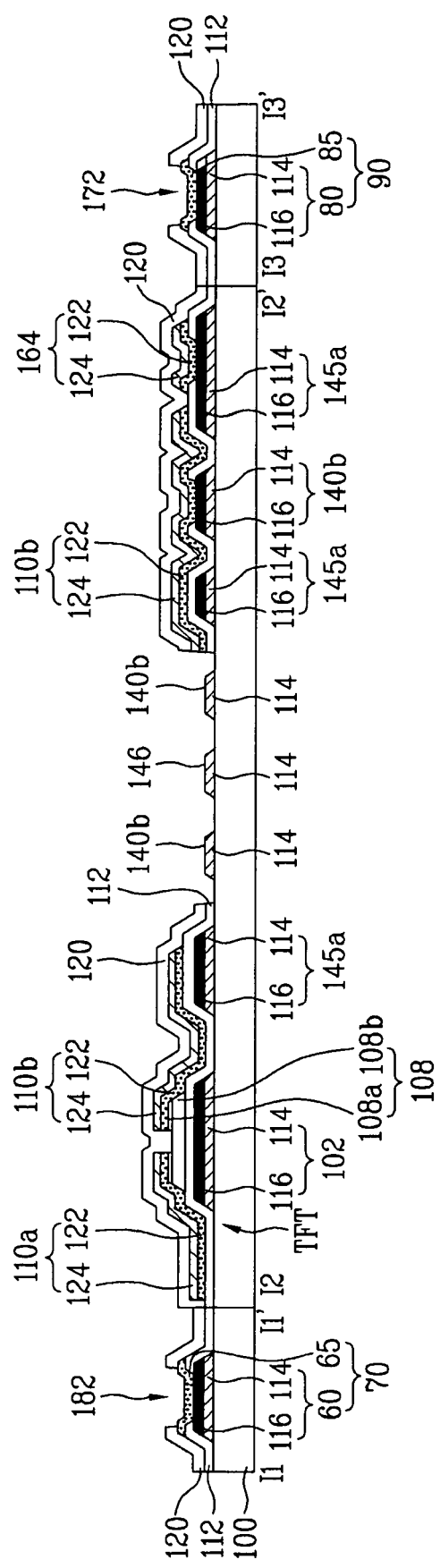

FIGS. 6A to 6C are plan and longitudinal-sectional views illustrating a fourth mask process in the thin film transistor substrate fabricating method in accordance with the first embodiment of the present invention.

With reference to FIGS. 6A to 6C, the passivation film 120 including the gate upper contact hole 182 and the data upper contact hole 172 is formed on the substrate 100 including the source/drain pattern.

Specifically, the passivation film 120 is formed on the entire surface of the substrate 100 including the source/drain pattern by a deposition method, such as plasma enhanced chemical vapor deposition (PECVD), and then a photoresist (not shown) is applied thereto. A photoresist pattern 204 exposing the pixel region including the gate pad 70, the data pad 90, the common electrodes 146, and the pixel electrode finger parts 140b is formed by aligning a fourth mask on the upper surface of the photoresist (not shown) and then exposing and developing the photoresist (not shown).

Thereafter, the gate upper contact hole 182 and the data upper contact hole 172 are formed by removing the passivation film 120 through a dry etching process using the photoresist pattern 204 to expose the gate upper pad 65 and the data upper pad 85, and the gate insulating film 112 and the passivation film 120 are removed to expose the pixel electrode finger parts 140b and the common electrodes 146 in the pixel region.

Thereafter, the uppermost layer of the gate upper pad 65, the data upper pad 85, the pixel electrode finger parts 140b, and the common electrodes 146 is selectively removed through a wet etching process using the photoresist pattern 204. Here, the pixel electrode finger parts 140b and the common electrodes 146 have a small line width through two times of the etching process, and thus an aperture ratio is enhanced. The pixel electrode finger parts 140b and the common electrodes 146 have a line width of 2~3 μm.

Further, the gate insulating film 112 and the passivation film 120 on the pixel electrode finger parts 140b and the common electrodes 146 on the pixel region are removed, and thus brightness is enhanced. Further, since the gate insulating film 112 and the passivation film 120 are not located on the pixel region, an amount of liquid crystals on non-pixel regions, i.e., an amount of unnecessarily filling liquid crystals, is reduced due to with a cell gap unchanged, and thus cost-saving is possible.

The passivation film 120 is formed by a deposition method, such as plasma enhanced chemical vapor deposition (PECVD), using an inorganic insulating material like the gate insulating film 112, or by a spin or spinless coating method using an acrylic organic compound having a small dielectric constant or an organic insulating material, such as benzocyclobutene (BCB) or perfluorocyclobutane (PFCB).

Since the semiconductor layer 108 is not formed under the data line 113, as described above, differing from a conventional 4-mask process, the separation distance between the data line 113 and the pixel electrode 140 or the common line 145 causing parasitic capacitance is reduced, compared with a case that the semiconductor layer 108 is formed under the data line 113. Thus, the area of the pixel region is increased, i.e., an aperture ratio is increased to the same level as that obtained by a 5-mask process.

Further, the semiconductor layer 108 is formed in an island shape having a smaller width than that of the gate electrode 102, and thus an off current (Ioff) property due to photo current is enhanced. Further, it is possible to solve problems, such shortening of the life span of the liquid crystal display device and deepening of an after-image, due to an increase in off current caused by the absorption of light from a backlight unit by the semiconductor layer 108.

Figure 7:
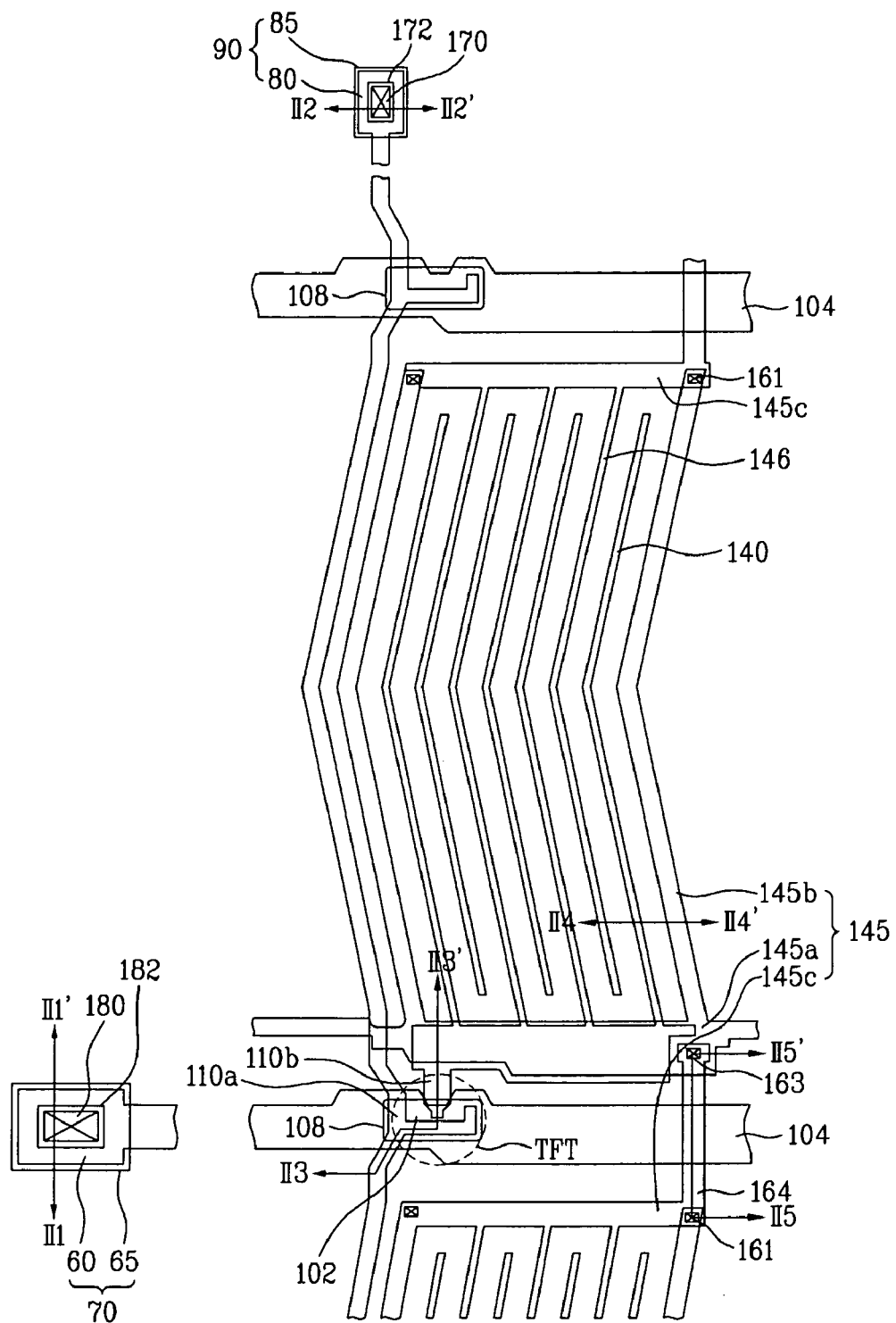
FIG. 7 is a plan view illustrating a thin film transistor substrate of an in-plane switching mode liquid crystal display device in accordance with a second embodiment of the present invention.
Figure 8:
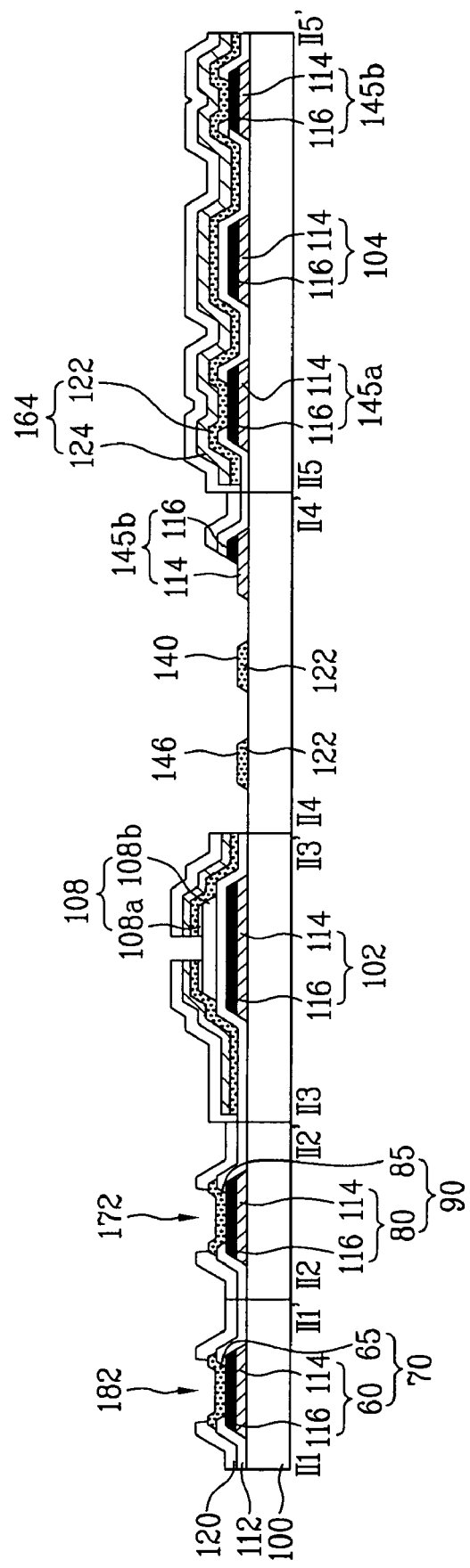
FIG. 8 is a longitudinal-sectional view illustrating the thin film transistor substrate taken along the lines II1-III' to II5-II5' of FIG. 7.

FIG. 7 is a plan view illustrating a thin film transistor substrate of an in-plane switching mode liquid crystal display device in accordance with a second embodiment of the present invention, and FIG. 8 is a longitudinal-sectional view illustrating the thin film transistor substrate taken along the lines II1-II1' to II5-II5' of FIG. 7.

A detailed description of some parts of the liquid crystal display device in this embodiment, as shown in FIGS. 7 and 8, which are substantially the same as those in the first embodiment, will be omitted because it is considered to be unnecessary.

With reference to FIGS. 7 and 8, the pixel electrode 140, which forms a horizontal electric field with the common electrodes 146 in a pixel region, are formed integrally with the source and drain electrode 110a and 110b.

The common line 145 include first common line 145a formed parallel with the gate line 104, second common line 145b connected to the first common line 145a and respectively formed at both sides of the pixel region parallel with the data line 113, and third common lines 145c, each of which is electrically connected to at least one second common line 145b via a first contact hole 162 and formed parallel with the gate line 104. Here, a common connection part 164 formed integrally with the third common line 145c and electrically connected to the first common line 145a via a second contact hole 160 is additionally provided.

The first and second common lines 145a and 145b are made of the same material as that of the gate line 104 and formed in the same layer as that of the gate line 104, and constitute a multilayered structure including at least two layers. Further, the data line 113, the third common line 145c, the common connection part 164, and the source and drain electrodes 110a and 110b are made of the same material and formed in the same layer, and constitute a multilayered structure including at least two layers. For example, the uppermost layer is made of any one material having high conductivity, selected from the group consisting of copper (Cu), molybdenum (Mo), aluminum (Al), aluminum-neodymium (AlNd), molybdenum-titanium (MoTi), chrome (Cr), and their combinations, and the lowermost layer is made of any one material having high anticorrosion, selected from the group consisting of indium tin oxide (ITO), tin oxide (TO), indium zinc oxide (IZO), indium tin zinc oxide (ITZO), molybdenum (Mo), chrome (Cr), titanium (Ti), molybdenum-titanium (MoTi), and their combinations.

The common electrode 146 and the pixel electrode 140 are formed in the same layer as the lowermost layer of the data line 113.

Figure 9A:
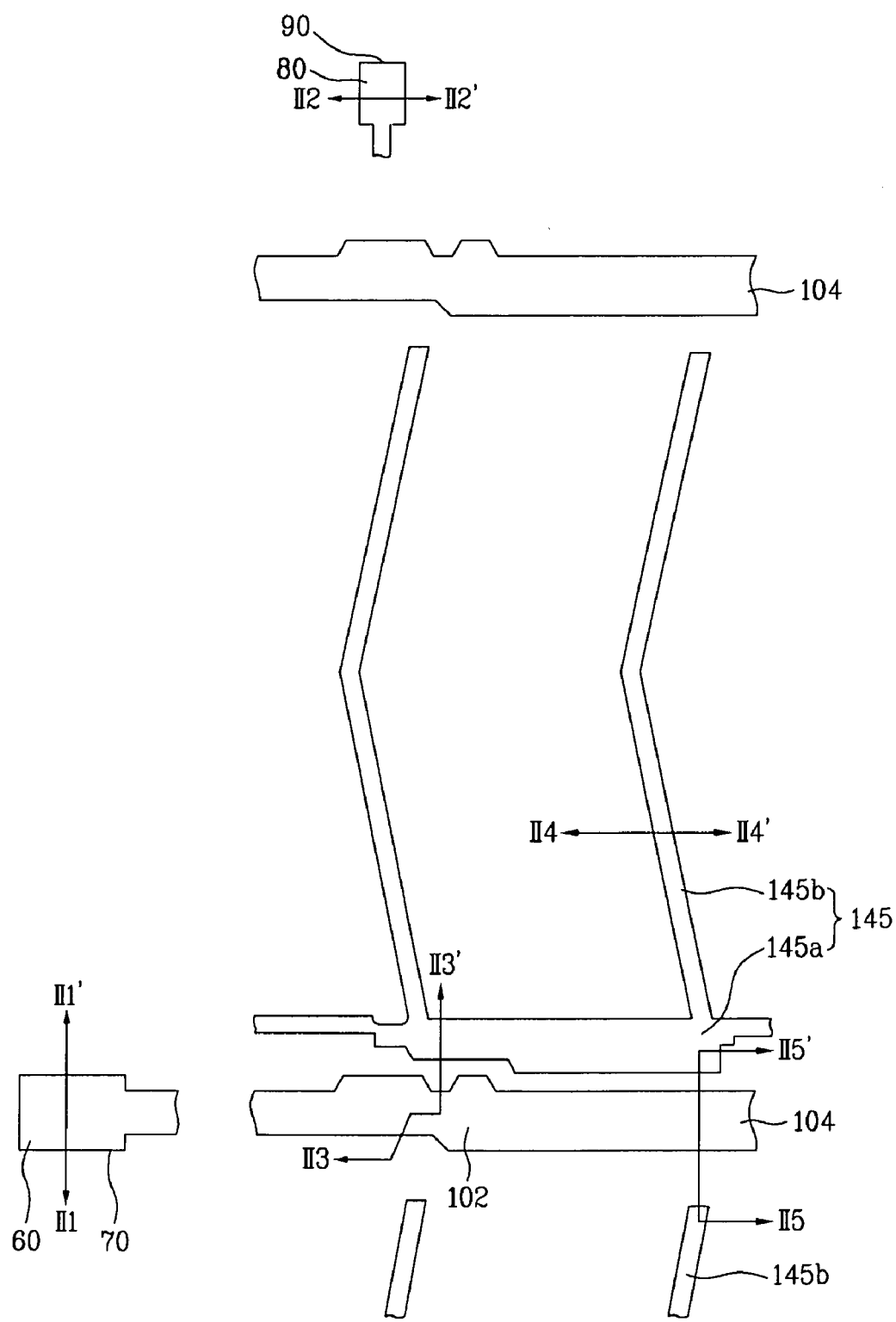

FIGS. 9A and 9B are plan and longitudinal-sectional views illustrating a first mask process in a thin film transistor substrate fabricating method in accordance with the second embodiment of the present invention.

With reference to FIGS. 9A and 9B, a gate pattern including the gate lower pad 60, the data lower pad 80, the gate line 104, the gate electrode 102, and the first and second common lines 145a and 145b is formed on the thin film transistor substrate 100.

Specifically, gate metal layers 114 and 116 are formed on the substrate 100 by a deposition method, such as sputtering. Then, the gate pattern including the gate lower pad 60, the data lower pad 80, the gate line 104, the gate electrode 102, and the first and second common lines 145a and 145b is formed through a photolithography process using a first mask and a wet etching process.

The gate metal layers 114 and 116 may constitute a multilayered structure including at least two layers. When the gate metal layers 114 and 116 constitute a multilayered structure including at least two layers, the uppermost layer is made of any one material selected from the group consisting of copper (Cu), molybdenum (Mo), aluminum (Al), aluminum-neodymium (AlNd), molybdenum-titanium (MoTi), chrome (Cr), and their combinations, and the lowermost layer is made of any one material selected from the group consisting of indium tin oxide (ITO), tin oxide (TO), indium zinc oxide (IZO), indium tin zinc oxide (ITZO), molybdenum (Mo), chrome (Cr), titanium (Ti), molybdenum-titanium (MoTi), and their combinations.

Figure 10A:
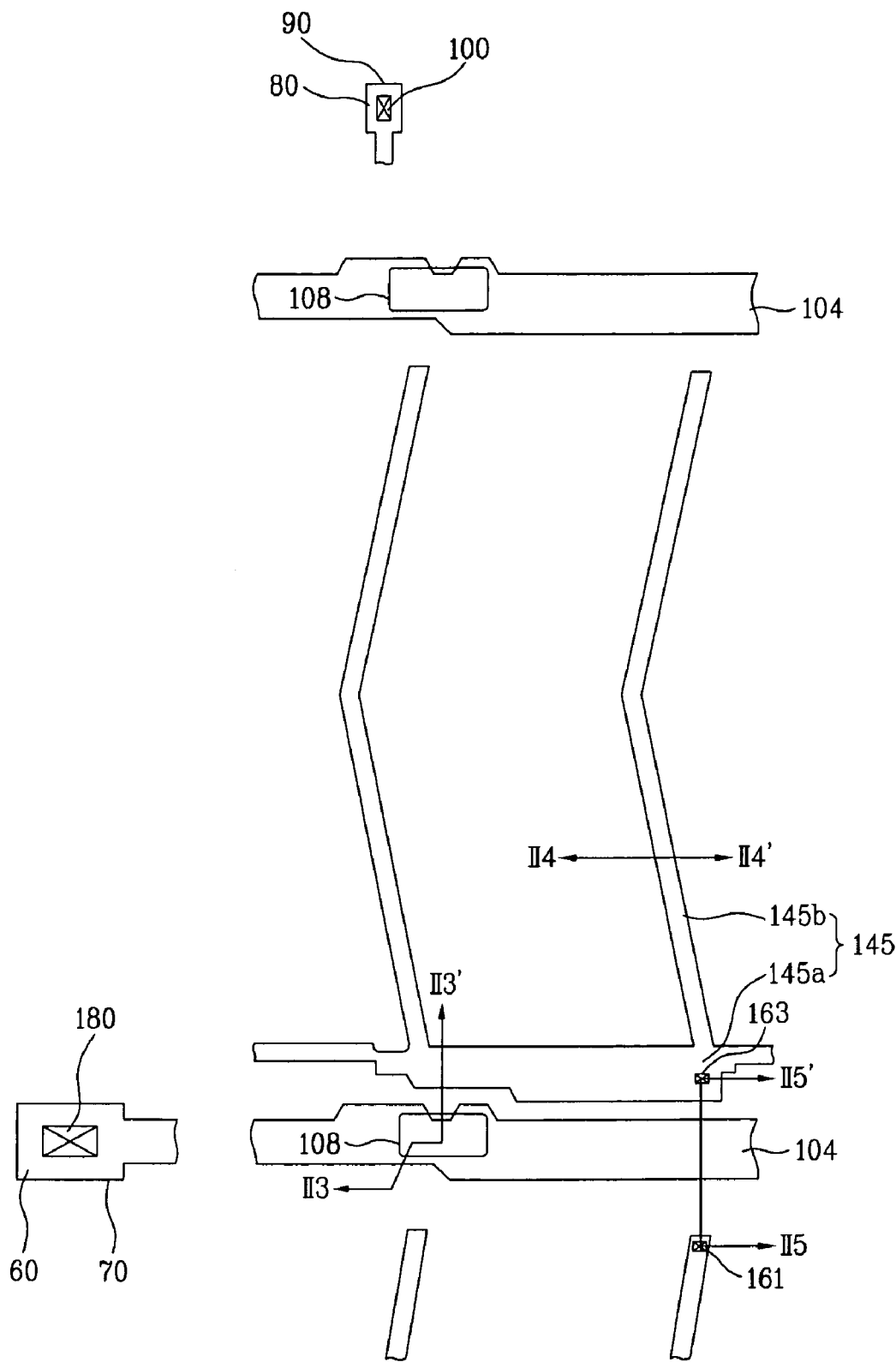
Figure 10C:
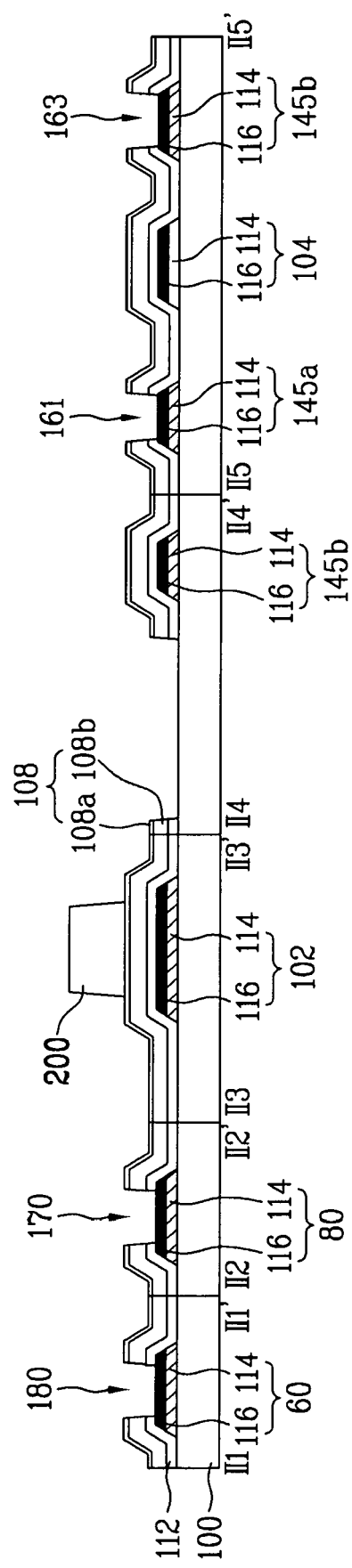

FIGS. 10A to 10C are plan and longitudinal-sectional views illustrating a second mask process in the thin film transistor substrate fabricating method in accordance with the second embodiment of the present invention.

With reference to FIGS. 10A to 10C, the gate insulating film 112 and the semiconductor layer 108 are sequentially formed on the gate pattern.

Specifically, the gate insulating film 112, an amorphous silicon (a-Si) layer 108b, and an amorphous silicon layer doped with impurity (n+) 108a are sequentially formed on the entire surface of the substrate 100 including the gate pattern by a deposition method, such as plasma enhanced chemical vapor deposition (PECVD), and then a photoresist (not shown) is applied thereto.

The gate insulating film 112 is made of an inorganic insulating material, such as silicon oxide ($SiO_x$) or silicon nitride ($SiN_x$).

A photoresist pattern 200 is formed by aligning a second mask (not shown) on the upper surface of the photoresist (not shown) and then exposing and developing the photoresist (not shown). The photoresist pattern 200 is formed to expose regions for the gate lower contact hole 180, the data lower contact hole 170, and the first and second contact holes 162 and 160 and pixel region, and the photoresist pattern 200 in regions corresponding to the thin film transistor (TFT) has a larger thickness than that of the photoresist pattern 200 in other regions.

Thereafter, the gate lower contact holes 180 exposing the gate lower pad 60, the data lower contact hole 170 exposing the data lower pad 80, the first contact hole 162 exposing the first common line 145a, and the second contact hole 160 exposing the second common line 145b are formed by etching the gate insulating film 112 and the semiconductor layer 108 using the photoresist pattern 200 as a mask, and the gate insulating film 112 and the semiconductor layer 180 on the pixel region are removed. Thereafter, the thickness of the photoresist pattern 200 is reduced by an ashing process. Thus, the photoresist pattern 200 remains only on the gate electrode 102, and is removed from other regions. Through a dry etching process using the photoresist pattern 200 on the gate electrode 102, the semiconductor layer 108 is formed in an island shape having a smaller width than that of the gate electrode 102 such that the semiconductor layer 108 overlaps with the gate electrode 102 under the condition that the gate insulating film 112 is interposed therebetween. The remaining photoresist pattern 200 is removed through a strip process.

The second mask employs a diffraction mask or a half tone mask to allow the photoresist pattern 200 to have a double step difference.

Figure 11A:
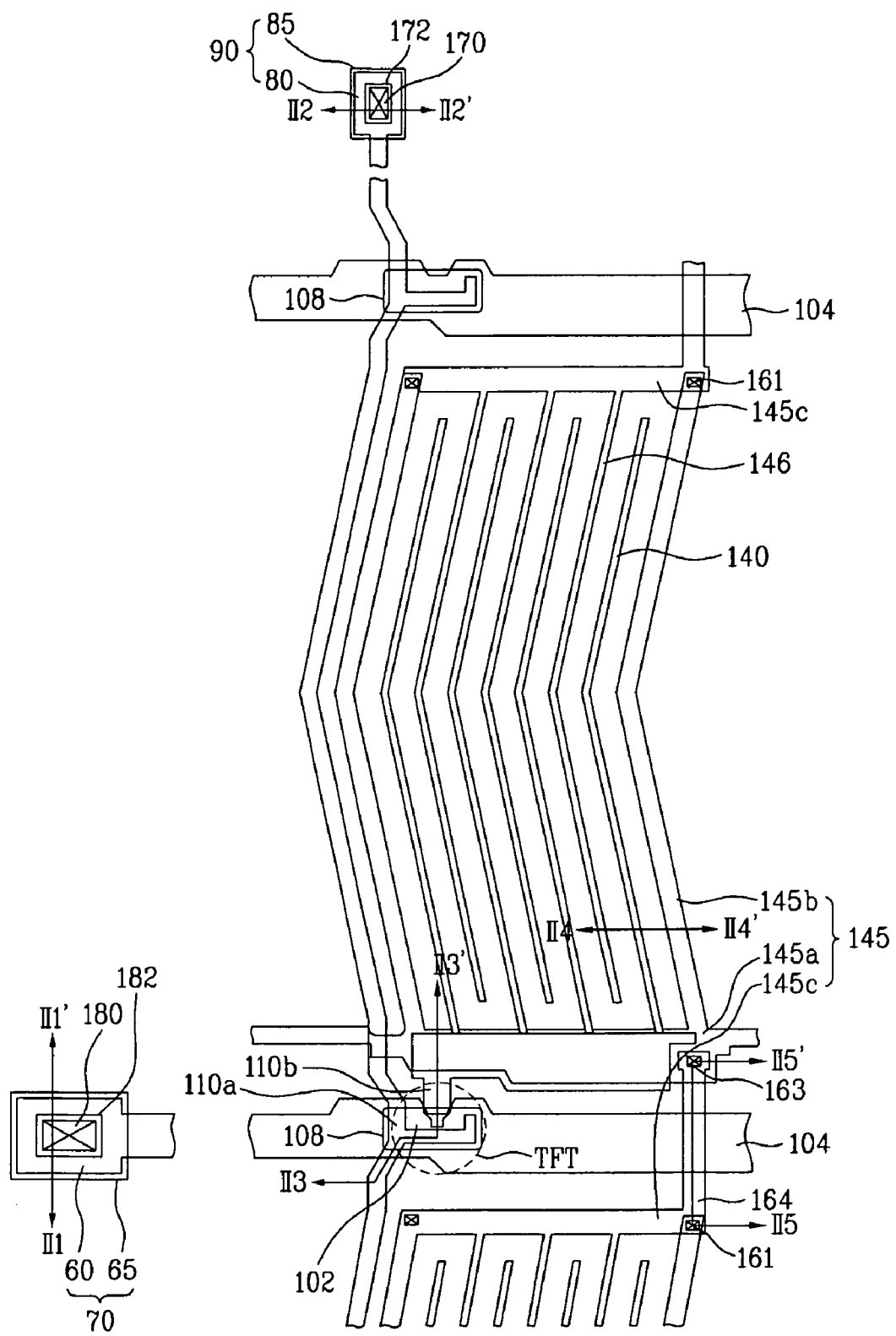
Figure 11B:
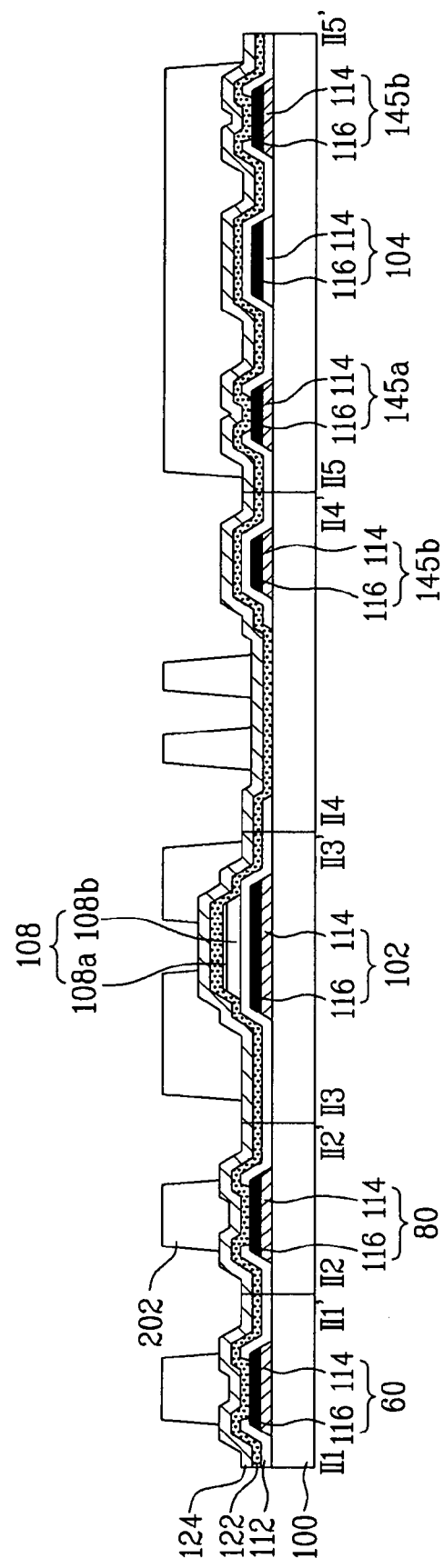

FIGS. 11A to 11C are plan and longitudinal-sectional views illustrating a third mask process in the thin film transistor substrate fabricating method in accordance with the second embodiment of the present invention.

With reference to FIGS. 11A to 11C, a source/drain pattern including the gate upper pad 65, the data upper pad 85, the third common line 145c, the common connection part 164, the data line 113, the pixel electrode 140, the common electrodes 146, and the source and drain electrodes 110a and 110b is formed on the gate insulating film 112 including the gate lower contact hole 180, the data lower contact hole 170, and the first and second contact holes 162 and 160.

Specifically, source/drain metal layers 122 and 124 are formed on the gate insulating film 112 including the gate lower contact hole 180, the data lower contact hole 170, and the first and second contact holes 162 and 160 by a deposition method, such as sputtering, and then a photoresist (not shown) is applied thereto. Thereafter, a photoresist pattern 202 corresponding to region for the gate pad 70, the data pad 90, the common connection parts 164, the common electrodes 146, the pixel electrode 140, and the source and drain electrodes 110a and 110b is formed by aligning a third mask on the upper surface of the photoresist (not shown) and then exposing and developing the photoresist (not shown).

Thereafter, the source/drain pattern including the gate upper pad 65, the data upper pad 85, the third common line 145c, the common connection parts 164, the data line 113, the pixel electrode 140, the common electrodes 146, and the source and drain electrodes 110a and 110b is formed by removing the source/drain metal layers 122 and 124 through a wet etching process using the photoresist pattern 202. Then, the ohmic contact layer 108a in channel regions between the source and drain electrodes 110a and 110b is removed by dry etching, and the remaining photoresist pattern 202 is removed through a strip process.

Here, the common connection parts 164 are formed integrally with the third common line 145c, and are electrically connected to the first common line 145a through the second contact holes 160. Thus, the first to third common lines 145a, 145b, and 145c are formed in a mesh structure, and thus minimally reduces load.

The source/drain metal layers 122 and 124 constitute a multilayered structure including at least two layers. The uppermost layer is made of any one material selected from the group consisting of copper (Cu), molybdenum (Mo), aluminum (Al), aluminum-neodymium (AlNd), molybdenum-titanium (MoTi), chrome (Cr), and their combinations, and the lowermost layer is made of any one material selected from the group consisting of indium tin oxide (ITO), tin oxide (TO), indium zinc oxide (IZO), indium tin zinc oxide (ITZO), molybdenum (Mo), chrome (Cr), titanium (Ti), molybdenum-titanium (MoTi), and their combinations.

Figure 12A:
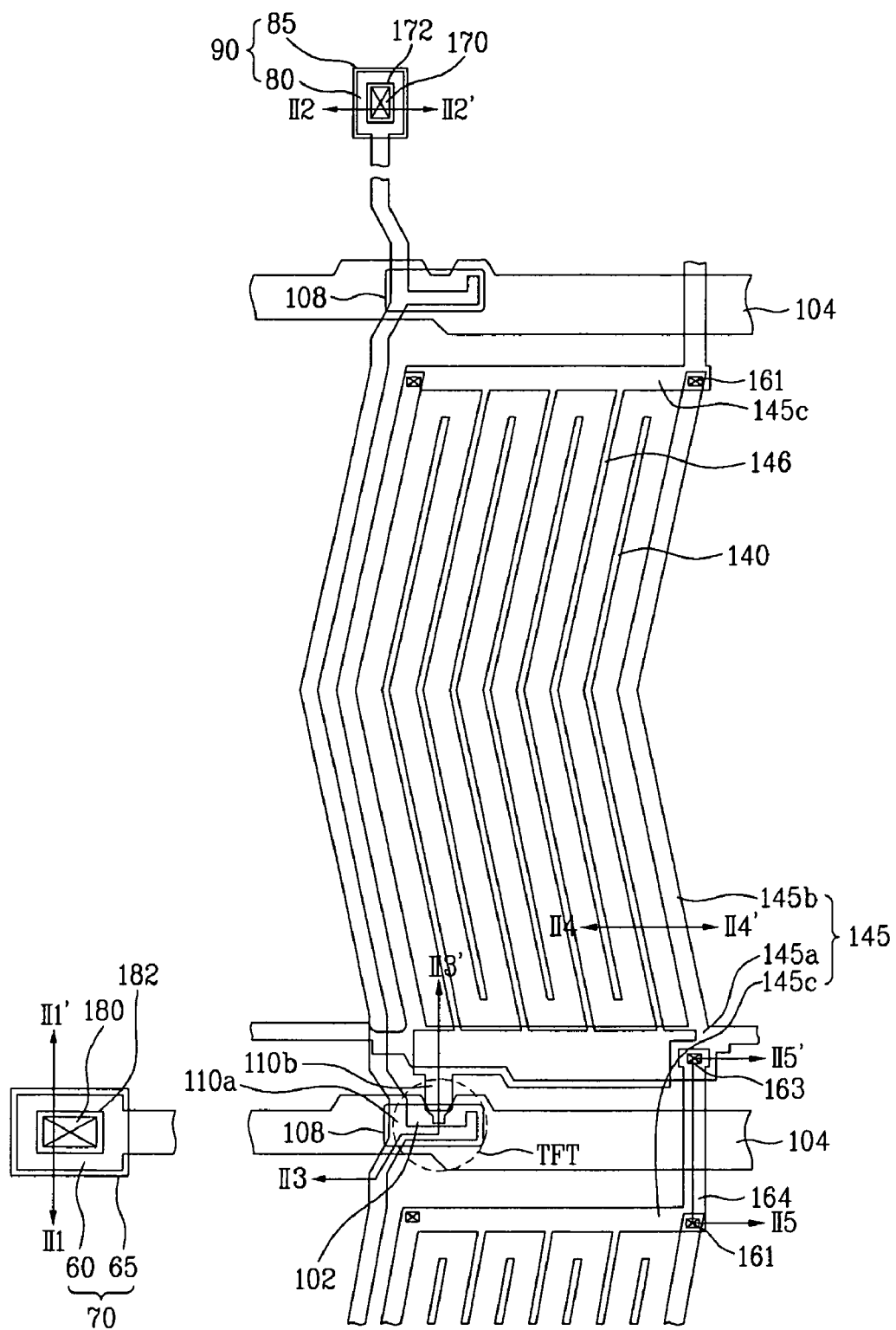
FIGS. 12A to 12C are plan and longitudinal-sectional views, respectively, illustrating a fourth mask process in the thin film transistor substrate fabricating method in accordance with the second embodiment of the present invention.
Figure 12B:
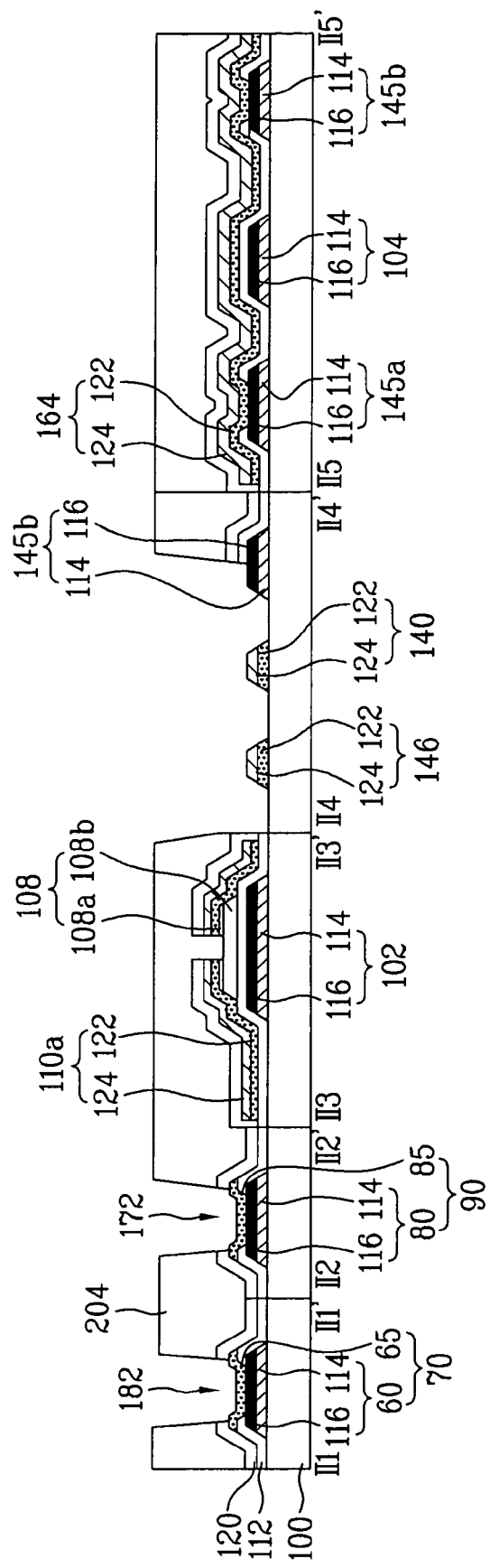
Figure 12C:
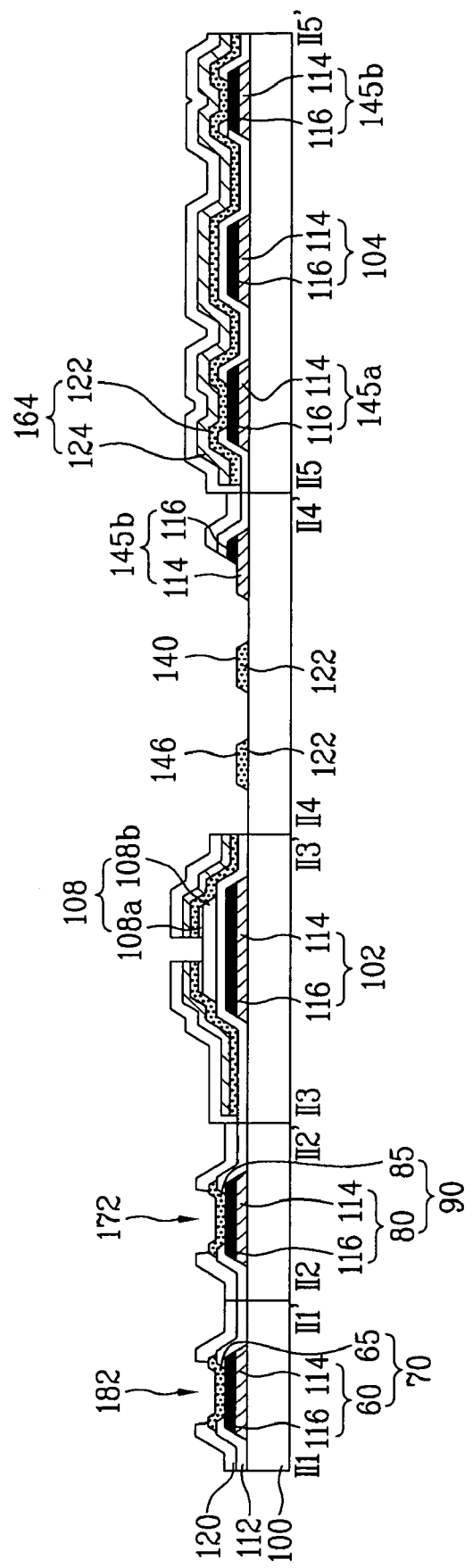

FIGS. 12A to 12C are plan and longitudinal-sectional views illustrating a fourth mask process in the thin film transistor substrate fabricating method in accordance with the second embodiment of the present invention.

With reference to FIGS. 12A to 12C, the passivation film 120 including the gate upper contact hole 182 and the data upper contact hole 172 is formed on the substrate 100 including the source/drain pattern.

Specifically, the passivation film 120 is formed on the entire surface of the substrate 100 including the source/drain pattern by a deposition method, such as plasma enhanced chemical vapor deposition (PECVD), and then a photoresist (not shown) is applied thereto. A photoresist pattern 204 exposing the pixel region including the gate pad 70, the data pad 90, the common electrodes 146, and the pixel electrodes 140 is formed by aligning a fourth mask on the upper surface of the photoresist (not shown) and then exposing and developing the photoresist (not shown).

Thereafter, the gate upper contact hole 182 and the data upper contact hole 172 are formed by removing the passivation film 120 through a dry etching process using the photoresist pattern 204 to expose the gate upper pad 65 and the data upper pad 85, and the gate insulating film 112 and the passivation film 120 are removed to expose the pixel electrodes 140 and the common electrodes 146 in the pixel regions. Further, parts of the gate insulating film 112 and the passivation film 120 adjacent to the pixel regions on the second common line 145b are removed.

Thereafter, the uppermost layer of the gate upper pad 65, the data upper pad 85, the pixel electrodes 140, and the common electrodes 146 and a part of the uppermost layer of the second common line 145b is selectively removed through a wet etching process using the photoresist pattern 204. Here, the pixel electrodes 140 and the common electrodes 146 have a small width through two times of the etching process, and thus an aperture ratio is enhanced. The pixel electrodes 140 and the common electrodes 146 have a line width of 2~3 μm.

Further, the gate insulating film 112 and the passivation film 120 on the pixel electrodes 140 and the common electrodes 146 on the pixel region are removed, and thus brightness is enhanced. Further, since the gate insulating film 112 and the passivation film 120 are not located on the pixel region, an amount of liquid crystals on non-pixel regions, i.e., an amount of unnecessarily filling liquid crystals, is reduced due to the formation of a uniform cell gap, and thus cost-saving is possible.

The passivation film 120 is formed by a deposition method, such as plasma enhanced chemical vapor deposition (PECVD), using an inorganic insulating material like the gate insulating film 112, or by a spin or spinless coating method using an acrylic organic compound having a small dielectric constant or an organic insulating material, such as benzocyclobutene (BCB) or perfluorocyclobutane (PFCB).

Since the semiconductor layer 108 is not formed under the data line 113, as described above, differing from a conventional 4-mask process, the separation distance between the data line 113 and the pixel electrode 140 or the common line 145 causing parasitic capacitance is reduced, compared with a case that the semiconductor layer 108 is formed under the data lines 113. Thus, the area of the pixel regions is increased, i.e., an aperture ratio is increased to the same level as that obtained by a 5-mask process.

Further, the semiconductor layer 108 in channel regions is formed in an island shape having a smaller width than that of the gate electrode 102, and thus an off current (Ioff) property due to photo current is enhanced. Further, it is possible to solve problems, such as shortening of the life span of the liquid crystal display device and deepening of an after-image, due to an increase in off current caused by the absorption of light from a backlight unit by the semiconductor layer 108.

The above-described liquid crystal display device of the present invention and the method for fabricating the same have effects, as follows.

Since the semiconductor layer is not formed under the data line, the separation distance between the data line and the pixel electrode or the common line causing parasitic capacitance is reduced, compared with a case that the semiconductor layer is formed under the data line. Thus, the area of the pixel regions is increased, i.e., an aperture ratio is increased to the same level as that obtained by a 5-mask process.

Further, the semiconductor layer is formed in an island shape having a smaller width than that of the gate electrode, and thus an off current (Ioff) property due to photo current is enhanced. Further, it is possible to solve problems, such as shortening of the life span of the liquid crystal display device and deepening of an after-image, due to an increase in off current caused by the absorption of light from a backlight unit by the semiconductor layer.

Moreover, the gate insulating film and the passivation film on the pixel electrode finger parts and the common electrodes on the pixel regions are removed, and thus brightness is enhanced. Since the gate insulating film and the passivation film are not located on the pixel regions, an amount of liquid crystals on non-pixel regions, i.e., an amount of unnecessarily filling liquid crystals, is reduced due to the formation of a uniform cell gap, and thus cost-saving is possible.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A liquid crystal display device, comprising:
    a gate line on a substrate;
    a data line crossing the gate line with a gate insulating film interposed between the gate line and the data line to define a pixel region;
    a thin film transistor at the crossing of the gate line and the data line;
    a pixel electrode connected to the thin film transistor;
    a common electrode forming a horizontal electric field with the pixel electrode in the pixel region;
    a gate pad connected to the gate line; and
    a data pad connected to the data line,
    wherein the gate pad and the data pad includes:
        a lower pad in the same layer as the gate line and made of the same material as the gate line,
        a lower contact hole through the gate insulating film to expose the lower pad,
        an upper pad in the same layer as the data line, made of the same material as the data line, and connected to the lower pad through the lower contact hole, and
        an upper contact hole through a passivation film protecting the thin film transistor to expose the upper pad, and
        a semiconductor layer of the thin film transistor overlaps with the gate electrode of the thin film transistor, and has a width smaller than that of a gate electrode of the thin film transistor.

2. The liquid crystal display device according to claim 1, wherein the gate line, the data line, the upper pad, and the lower pad includes:
    an uppermost layer made of any one material selected from the group consisting of copper (Cu), molybdenum (Mo), aluminum (Al), aluminum-neodymium (AlNd), molybdenum-titanium (MoTi), chrome (Cr), and their combinations; and
    a lowermost layer made of any one material selected from the group consisting of indium tin oxide (ITO), tin oxide (TO), indium zinc oxide (IZO), indium tin zinc oxide (ITZO), molybdenum (Mo), chrome (Cr), titanium (Ti), molybdenum-titanium (MoTi), and their combinations; and
    the pixel electrode and the common electrode form the lowermost layer in the same layer as one of the gate line and the data line.

3. The liquid crystal display device according to claim 1, further comprising common line to supply common voltage to the common electrode, wherein the common line includes:
    a first common line parallel with the gate line; and
    a second common line connected to each of the first common line and parallel with the data line.

4. The liquid crystal display device according to claim 3, further comprising a common connection part, which connects the first common line and the second common line being adjacent to each other crossing the gate line.

5. The liquid crystal display device according to claim 4, wherein the pixel electrode further comprises a pixel electrode finger part connected to a drain electrode of the thin film transistor and formed parallel with the common electrode and a pixel electrode horizontal part connected to the pixel electrode finger part and formed parallel with the gate line.

6. The liquid crystal display device according to claim 5, wherein the first common line at the contact region between the pixel electrode finger part and the drain electrode has a depressed shape such that the first common line at the contact region does not overlap with the pixel electrode finger part.

7. The liquid crystal display device according to claim 3, further comprising a third common line connected to at least one of the second common lines and formed parallel with the gate line and a common connection part formed integrally with the third common line and connected to the first common line.

8. The liquid crystal display device according to claim 7, wherein the first and second common lines are made of the same material as the gate line and formed in the same layer as the gate line, and the third common line and the common connection part are made of the same material as the data line and formed in the same layer as the data line.

9. The liquid crystal display device according to claim 1, wherein the semiconductor layer is not under the data line.

10. The liquid crystal display device according to claim 1, wherein the gate insulating film and the passivation film on the pixel region are removed to expose the substrate.

11. A method for fabricating a liquid crystal display device, comprising:
    forming a gate pattern including a gate line, a gate electrode, a gate lower pad, and a data lower pad on a substrate;
    forming a gate insulating film, including lower contact holes to expose the gate lower pad and the data lower pad, and a semiconductor layer overlapping the gate electrode on the substrate provided with the gate pattern;

forming a source/drain pattern including a gate upper pad, a data upper pad, a data line, and source and drain electrodes on the gate insulating film provided with the semiconductor layer;

forming upper contact holes to expose the gate upper pad and the data upper pad, and a passivation film to expose pixel region on the source/drain pattern; and forming a common electrode and a pixel electrode when the gate pattern or the source/drain pattern is formed, wherein the forming of the passivation film includes:

forming the passivation film on the source/drain pattern, removing the passivation film to expose the gate upper pad and the data upper pad, removing the gate insulating film and the passivation film on the pixel region to expose the pixel region, and removing the uppermost layer of the pixel electrode and the common electrode on the pixel region.

12. The method according to claim 11, wherein the gate line, the data line, the gate lower pad, the data lower pad, the gate upper pad, and the data upper pad includes:

an uppermost layer made of any one material selected from the group consisting of copper (Cu), molybdenum (Mo), aluminum (Al), aluminum-neodymium (AlNd), molybdenum-titanium (MoTi), chrome (Cr), and their combinations; and a lowermost layer made of any one material selected from the group consisting of indium tin oxide (ITO), tin oxide (TO), indium zinc oxide (IZO), indium tin zinc oxide (ITZO), molybdenum (Mo), chrome (Cr), titanium (Ti), molybdenum-titanium (MoTi), and their combinations; and the pixel electrode and common electrode form the lowermost layer in the same layer as one of the gate line and the data line.

13. The method according to claim 11, further comprising forming common line to supply common voltage to the common electrodes, including:

forming a first common line parallel with the gate line; and forming a second common line connected to each of the first common line and parallel with the data line.

14. The method according to claim 13, further comprising forming a common connection part, which connects the first common line and the second common line being adjacent to each other under crossing the gate line.

15. The method according to claim 14, wherein the pixel electrode includes a pixel electrode finger part connected to a drain electrode of the thin film transistor and formed parallel with the common electrode and a pixel electrode horizontal part connected to the pixel electrode finger part and formed parallel with the gate line.

16. The method according to claim 15, wherein the first common line at the contact region between the pixel electrode finger part and the drain electrode is formed so as to have a depressed shape such that the first common line at the contact region does not overlap with the pixel electrode finger part.

17. The method according to claim 13, wherein the common line further comprises a third common line connected to at least one of the second common lines parallel with the gate line, and wherein the method further comprises:

forming a common connection part integrally with the third common line and connected to the first common line.

18. The method according to claim 17, wherein the first and second common lines are made of the same material as that of the gate line and formed in the same layer as that of the gate line, and the third common line and the connection part are made of the same material as that of the data line and formed in the same layer as that of the data line.

* * * * *